United States Patent
Marek

(10) Patent No.: US 6,833,701 B2
(45) Date of Patent: Dec. 21, 2004

(54) STABILIZATION OF TRANSVERSE MAGNETIZATION IN SUPERCONDUCTING NMR RESONATORS

(75) Inventor: Daniel Marek, Moeriken (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/287,882

(22) Filed: Nov. 5, 2002

(65) Prior Publication Data

US 2003/0098689 A1 May 29, 2003

(30) Foreign Application Priority Data

Nov. 27, 2001 (DE) .......................................... 101 57 972

(51) Int. Cl.$^7$ ................................................ G01V 3/00
(52) U.S. Cl. ................................... 324/307; 324/318
(58) Field of Search ........................ 324/300, 307–309, 324/317–322

(56) References Cited

U.S. PATENT DOCUMENTS

| | | | | |
|---|---|---|---|---|
| 3,435,333 A | * | 3/1969 | Gallo et al. ................. | 324/313 |
| 3,609,519 A | * | 9/1971 | Seki et al. ................... | 324/313 |
| 3,714,553 A | * | 1/1973 | Keller ......................... | 324/319 |
| 3,777,254 A | * | 12/1973 | Kleiman et al. ............. | 324/308 |
| 3,826,972 A | * | 7/1974 | Day et al. .................... | 324/313 |
| 4,110,681 A | * | 8/1978 | Hofer et al. ................. | 324/313 |
| 4,339,717 A | * | 7/1982 | Tsuda et al. ................ | 324/313 |
| 4,685,468 A | * | 8/1987 | Macovski .................... | 600/410 |
| 4,862,085 A | * | 8/1989 | Aubert et al. ............... | 324/315 |
| 4,931,735 A | * | 6/1990 | Overweg et al. ........... | 324/318 |
| 5,023,555 A | * | 6/1991 | Ehnholm ..................... | 324/318 |
| 5,166,620 A | * | 11/1992 | Panosh ........................ | 324/322 |
| 5,214,383 A | * | 5/1993 | Perlmutter et al. ......... | 324/313 |
| 5,247,256 A | * | 9/1993 | Marek ......................... | 324/321 |
| 5,572,127 A |   | 11/1996 | Wong | |
| 5,585,723 A |   | 12/1996 | Withers | |
| 5,619,140 A |   | 4/1997 | Brey | |
| 5,814,992 A | * | 9/1998 | Busse-Grawitz et al. ... | 324/318 |
| 5,986,453 A | * | 11/1999 | Anderson et al. ........... | 324/300 |
| 6,037,775 A | * | 3/2000 | Shenoy et al. .............. | 324/320 |
| 6,097,187 A | * | 8/2000 | Srivastava et al. .......... | 324/320 |
| 6,121,776 A |   | 9/2000 | Marek | |
| 6,201,392 B1 | * | 3/2001 | Anderson et al. ........... | 324/300 |
| 6,411,092 B1 | * | 6/2002 | Anderson .................... | 324/319 |
| 6,437,570 B2 | * | 8/2002 | Marek ......................... | 324/321 |
| 6,441,617 B2 | * | 8/2002 | Marek ......................... | 324/318 |
| 6,466,019 B2 | * | 10/2002 | Marek ......................... | 324/318 |

FOREIGN PATENT DOCUMENTS

| | | |
|---|---|---|
| WO | WO 99/24821 | 5/1999 |
| WO | WO 99/24845 | 5/1999 |

* cited by examiner

Primary Examiner—Christopher W. Fulton
Assistant Examiner—Dixomara Vargas
(74) Attorney, Agent, or Firm—Paul Vincent

(57) ABSTRACT

A nuclear magnetic resonance (NMR) spectrometer with a magnet arrangement (1) for generating a homogeneous static magnetic field $B_0$ in the direction of a z axis and a radio frequency (RF) resonator (2) for receiving NMR signals from a measuring volume which has one or more superconducting components, is characterized in that a stabilization device is provided which keeps the magnetic field components $B_T$, transverse to the homogeneous magnetic field $B_0$, which acts on the superconducting components of the RF resonator (2), constant. The stabilization device can act actively or passively. It is thereby possible to completely suppress generation of disturbing transverse magnetization for RF resonator coils with superconducting components. Moreover, a demagnetised coil always remains demagnetised during the entire subsequent operation.

49 Claims, 21 Drawing Sheets

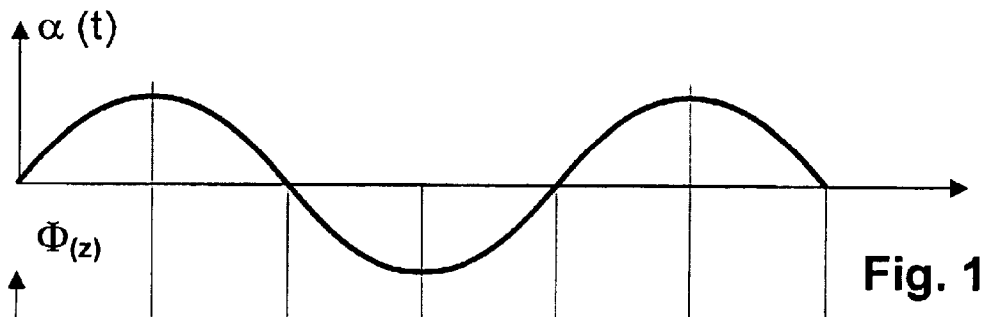
Fig. 16 a
Fig. 16 b
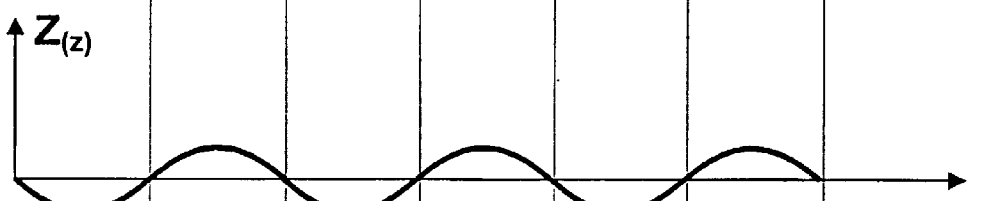
Fig. 16 c
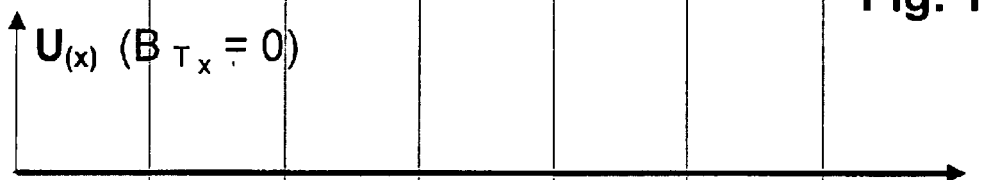
Fig. 16 d
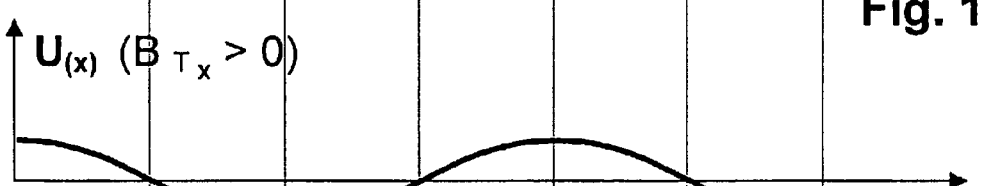
Fig. 16 e
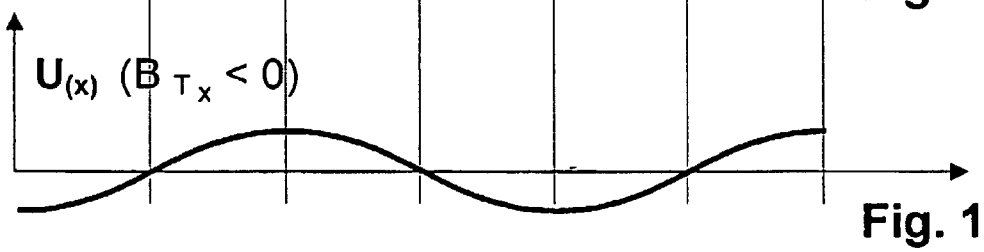
Fig. 16 f

STABILIZATION OF TRANSVERSE MAGNETIZATION IN SUPERCONDUCTING NMR RESONATORS

This application claims Paris Convention priority of DE 101 57 972.1 filed Nov. 27, 2001 the complete disclosure of which is hereby incorporated by reference.

BACKGROUND OF THE INVENTION

The invention concerns a nuclear magnetic resonance (NMR) spectrometer with a magnet arrangement for generating a homogeneous static magnetic field $B_0$ in the direction of a z axis and a radio frequency (RF) resonator containing one or more superconducting components for receiving NMR signals from a measuring volume.

An arrangement of this type is known from U.S. Pat. No. 5,619,140 (Reference [1]).

NMR is a highly distinctive and precise method for analyzing the structure of chemical compounds. However, it is not very sensitive. For this reason it is of primary importance in NMR to provide resonators which have maximum detection sensitivity, i.e. maximum S/N ratio.

The use of cooled and in particular superconducting RF resonators minimizes the losses in the resonator thereby considerably increasing the sensitivity. The currently most suitable superconductors are high-temperature superconductor (HTS) materials. They have a high transition temperature and are much less sensitive to static magnetic fields than are other superconductors.

The substance to be measured is usually a liquid and is contained in a measuring tube which is normally at room temperature, separated by an intermediate tube and a vacuum chamber from the cold NMR resonator which is at approximately 20K.

Arrangements with cooled superconducting RF coils are described e.g. in [1] or [7]. FIG. 2 schematically shows a cross-section through an NMR magnet with shim system and cryo probe head with cooled superconducting RF coil (resonator). An RF coil arrangement of this type is schematically shown in FIGS. 3a and b. FIG. 3a is a perspective view and FIG. 3b a section in the xz plane.

The substantial problem in using superconductors in NMR receiving systems (RF receiver coil) is their static magnetization. If not controlled, it can produce field disturbances within the sample of such a magnitude that the line width becomes unacceptably large. A number of methods have been published which minimize this undesired magnetization [2], [3] or which at least try to minimize it [4].

The described methods have, however, the serious drawbacks which are described below. In particular, even with disturbance-free coils, subsequent undesired applied transverse magnetic fields lead to the recurrence of substantial disturbance fields.

It is therefore the underlying purpose of the present invention to prevent the occurrence of disturbing magnetization in RF coils of [1]. If the methods according to [2],[3] are used for these coils, their magnetization can be substantially eliminated. The major problem arises during subsequent operation, since undesired mechanical tilting of the coils with respect to the magnet could re-magnetize these coils. The present invention should also permit a coil that has been demagnetised once to always remain demagnetised during its entire subsequent operation.

In addition to the coil types [1] there is an additional type of known superconducting RF coil (described in [5] and [6]) which are already highly insensitive to possible disturbing transverse fields.

The positive effects of the inventive device are also compatible with these additional coil types ([5],[6]) and are, in fact, cumulative, i.e. the present invention further reduces the remaining, very small disturbances of these coil types by an additional substantial factor.

The range of applications of certain configurations of these coils is also extended. The combination results in extremely disturbance-free and long-term stable superconducting RF coil arrangements which meet the highest of standards, far beyond those of prior art, in terms of freedom from disturbance and stability, thereby offering new fields of application.

As shown in detail in [2] and [6], currents flowing in closed paths within a type II superconductor lead to an overall magnetization of the superconductor. They are determined by the previous history of the superconductor and remain for an essentially unlimited length of time due to the zero resistance of the superconductor, as long as the external conditions remain unchanged.

In the conventionally used thin layer coils (e.g. [1] or FIGS. 3a, b), this magnetization has predominant importance mainly in the direction perpendicular to the substrate, since the surface in which the associated current flows is the largest. This transverse magnetization $M_T$ (FIG. 6a) has substantially greater impact than does the longitudinal magnetization (in the z direction), since the extremely thin layer presents a very small surface available for longitudinal magnetization (which, together with the current loop, generates a dipole moment).

In any event, magnetization generates an additional magnetic field outside of the superconductor which can cause strong, undesired field disturbances in the sample volume. FIG. 6b schematically shows the effects of transverse magnetization on the field disturbances outside of the RF coil and in particular on the $B_z$ component inside the NMR sample.

The task at hand is therefore to minimize the transverse magnetization $M_T$ which could otherwise greatly disturb operation.

Terminology

SC coils are discussed in detail below which are tilted with respect to the static field $B_0$ of the magnet. This requires precise definition of the terminology and, in particular, of the coordinate system used.

The term "transverse magnetic field change" is an additional magnetic field component $dB_T$ in the coordinate system of the superconducting coil, which is perpendicular to the direction of the static magnetic field $B_0$ existing prior to this change. This also corresponds, to first order in the coordinate system of the SC coil, to a rotation of the static magnetic field relative to the SC coil, which is equivalent to rotation of the coil with respect to the static magnetic field.

For the flat or sheet-like superconducting structures which are primarily considered herein and which are oriented substantially parallel to the magnetic field, this causes magnetization of the superconductor in the direction perpendicular to the superconductor surface. We call it "transverse magnetization". This magnetization $M_T$ is oriented in first order perpendicularly to the static field $B_0$.

The previous approach for minimizing disturbances in the spectra through inhomogeneities of the static magnetic field utilized the following strategies:

1. Minimize the maximum possible magnetization magnitude (through subdivision of the coil into sufficiently narrow strips [1], [5]).

2. Attempt to suppress generation of remaining possible magnetization through slow cooling of the superconductor in the field [4].

3. Post-treatment of the superconducting coil with a sequence of decreasing transverse magnetic fields for "demagnetisation" [2], [3] (thereby inducing a current structure with closely spaced, opposing current regions such that the sum of the individual magnetic field contributions cancels to a good approximation).

4. Design the superconducting structure of the coil such that disturbances in the magnetic field are allowed but the RF active field is limited through normally conducting elements to a field with only very slight disturbances [5].

5. Design the superconducting coil structure such that disturbances in the magnetic field are permitted while effecting a uniform distribution of magnetization in the z direction through an elongated construction of the coils having a macroscopically homogeneous distribution of the superconducting material, however with RF interruptions [6]. One can thereby show that these coils can strongly disturb the $B_x$ and $B_y$ components of the magnetic field but the $B_z$ component remains undisturbed except for a very slight waviness. Since only the $B_z$ component is relevant for NMR, the spectrum remains nearly free from artefacts. The methods mentioned above have the following disadvantages:

1. The coils of the type described in [1] can be demagnetised through the methods [2], [3]. The problem arises later during operation. For typical geometries of an HTS coil according to [1], as shown in FIGS. 3a, b (coil as thin layer of YBCO on sapphire substrate, oriented substantially parallel to the static field $B_0$, total width of the coil conductor several mm, divided into small strips with a width of between 10 and 20 $\mu$m with a mutual separation of a few $\mu$m, layer thickness approximately 300 nm, lateral separation of the coil from the NMR sample to be examined of a few mm, typically in the range of 1–5 mm), small changes $dB_T$ in the transverse fields acting on the superconducting layer of a magnitude of 1 G are sufficient to produce transverse magnetizations $M_T$ in a previously not magnetized (or previously demagnetised) coil (FIG. 6a) which, in turn, produce significant changes in the proton resonance frequency within the sample.

The spatial extension and curvature of the field lines associated with a transverse magnetization of the superconductor influences the NMR-relevant $B_z$ component in the adjacent sample (FIG. 6b). This produces disturbing line broadenings and line distortions in the NMR spectrum. An extremely small disturbance of the $B_z$ component in the sample of less than 1 mG is thereby sufficient to produce large artefacts in the spectrum: a change of the $B_z$ component by 0.000234 G corresponds to a frequency change of 1 Hz for protons.

For typical geometries, we obtain in the sample a disturbance of 0.03–6 Hz per 1 G transverse field change $dB_T$ in the region of the coil, wherein the coefficient and the exact form of the disturbance depend on the exact geometrical relationships. A change in the transverse component of $dB_T$=1 G corresponds to tilting of the RF coil with respect to the magnet by approximately 0.00057 degrees for a magnet with a $B_0$ of 10 T. This corresponds to an extremely small tilting of 10 $\mu$m/m (10 micrometers over 1 meter) (−>5–1000 G per 0.1 degree tilting).

2. Transverse fields of the above-mentioned magnitude already have negative effects on the spectrum but are generally reversible, i.e. when the transverse field disappears, the disturbances also disappear. For transverse fields of approximately 20 G and more, magnetization of the superconductor is irreversibly changed since shielding currents are formed which exceed the critical current density of the material for a constantly increasing region of the superconductor (starting from the edges). This produces an increasingly hysteretic behavior with the consequence that after tilting, the static magnetic field in the measuring volume becomes irreversibly inhomogeneous.

For the typical geometries mentioned above, this produces a field disturbance in the sample on the order of 0.6–120 Hz producing completely useless spectra for high resolution applications. A transverse magnetic field of 20 G corresponds, for $B_0$ of 10 T, to a tilt of 0.011 degrees (corresponding to a tilt of 200 $\mu$m/m or 2 $\mu$m/cm).

3. Tilting which exceeds the reversible limit eventually leads, for transverse fields of approximately 500 G (corresponds to approximately 0.28 degrees or 5 mm/m for 10 T) to the critical current density in each individual superconducting element and therefore to a complete magnetization of the superconducting coil elements, as described in [2]. This produces frequency disturbances in the sample on the order of 3–1000 Hz.

4. It must be noted that this tilting is a tilting of the magnetic field of the magnet with respect to the SC coils. FIG. 4 shows a magnet system with field lines parallel to the superconducting layer of the RF coil.

The above-mentioned tilting can be produced through motion of the coils within the probe head (FIG. 5a) and also through motion of the magnet with respect to the probe head or Dewar (FIG. 5b).

The magnitudes of the angles show that point 1 corresponds to a tilting of 10 $\mu$m/m and point 2 even reaches irreversibility at approximately 200 $\mu$m/m. Considering the soft (in particular lateral) suspension of a cryomagnet in the Dewar one can immediately see that the above conditions cannot be maintained under normal circumstances.

As a consequence, the systems described in [1] cannot function satisfactorily in practice even though the further methods of [2]–[4] would be successful, in particular not over longer periods of time (merely consider motion of the magnet on vibrational absorbers, decreasing weight in association with evaporation of the cryogenic liquids, etc. . . . ).

5. The coils of [5] and [6] are largely immune to these transverse changes and can therefore actually produce the first operative and long-term stable NMR systems at the cost of considerable limitation of the geometrical freedom and efficiency of the design, in both cases, which produces certain losses in RF performance.

6. When the coils of [6] are exposed to a transverse magnetic field, they produce, depending on the individual geometrical design, a slight waviness in the $B_z$ field which can be very small depending on the geometry but can also have disturbing effects. Certain embodiments of these coils [6] function only up to a maximum transverse magnetic field (below the reversibility limit, see above item 2). The compensation effect is thereby lost and the coils have considerably worse properties which, depending on the ratio of the critical currents parallel and perpendicular to the $B_0$ field and the geometries of the elements, only have a small advantage over coils of [1].

It is therefore very important for this subclass of coils that they never experience an excessively high transverse field (after cooling below $T_c$). For this reason, it is advantageous for certain subclasses of the coils [6] when the transverse magnetic field stays within certain limits, which must not necessarily be excessively narrow.

The remaining waviness of all coils of type [6] is also proportional to the transverse magnetization. This can again be controlled by the transverse magnetic field. If the field remains small, this transverse magnetization also becomes small thereby considerably further reducing the remaining residual disturbances.

All above-discussed publications concerning prior art according to [1]–[3] are based on the assumption that cooling of a superconducting coil produces tilts relative to the magnetic field. For this reason, methods were developed to eliminate the resulting transverse magnetization. Subsequent problems were not discussed.

[6] recognized the problems related to tilts and new coil structures were presented which are largely immune to such tilting.

The absolute size of the tilts is extremely small and were regarded as a given, unavoidable condition.

The present invention takes the diametrally opposed viewpoint and avoids all above-mentioned problems by presenting a device which prevents changes in the transverse field component right from the outset.

It is therefore the underlying purpose of the present invention to prevent an initial occurrence of disturbing transverse magnetization in an NMR spectrometer of the above-mentioned kind, having RF coils with superconducting components.

SUMMARY OF THE INVENTION

This purpose is achieved in accordance with the invention in a surprisingly simple and also effective manner by providing a stabilization device which keeps constant the magnetic field components $B_T$, which act on the superconducting components of the RF resonator and which are transverse to the homogeneous magnetic field $B_0$.

The inventive arrangement permits operation of practically all coils which consist of type II superconductor in accordance with prior art, with extremely little disturbances produced thereby to the static magnetic field.

The surprising effect of the invention is substantially based on the following points:

The tilts are extremely small and it is not initially obvious how they can be controlled at all. The magnitude is, as mentioned above, in the region of approximately 10–100 μm/m or approximately 100 nm–1 μm/cm. Depending on the exact requirements, the angular orientation of the superconducting coils must be in this range. The above values are based on a magnet having a field of 10 T. For higher fields, the angular requirements become even more stringent.

The position having the above-mentioned accuracy must also be absolutely stable over the long-term. Considering the fact that all mechanical components tend to "creep" and that electronic components have instabilities and drifts, this would appear to be hopeless. Moreover, possible devices for measuring the transverse magnetic field must not disturb the field homogeneity.

The above provide good reasons why no previous attempts have been made to actually control the transverse field acting on the superconducting coils.

Moreover, it must be initially recognized that a systematic, consistent control is required, since the problem of orientation does not merely concern the orientation and stability of the RF coils within (with respect to) the probe head(s) but rather that of the overall RF coils relative to the magnet which CANNOT be maintained within the above-mentioned limits. Attempts to solve the transverse field change problem with a very rigid structure of the probe head and the superconducting coils alone are therefore bound to failure. This is a very important realization.

In this context, two additional background remarks can be made:

a) For probe heads which have an RF coil made from a normally-conducting metal and which otherwise have no additional superconducting components, the magnetization produced by all the components is substantially parallel to the $B_0$ field. This magnetization is then proportional to the magnetic field with regard to magnitude and direction. The magnitude is extremely small since only materials are used which intrinsically cause only small disturbances and/or which consist of magnetically compensated materials (volume susceptibility in high resolution applications of approximately $10^{-7}$ MKS). A small disturbance remains a small disturbance even when the orientation with respect to the magnetic field changes. For magnetically compensated arrangements, which are based on materials of identical susceptibility which are continuous in the z direction (such as the sample tube and the sample itself) the disturbances produced through tilting depend on the square of the tilt angle and can therefore be neglected for small tilt angles. Were it not for this feature, the relatively soft suspension of the magnet with respect to the probe head would preclude production of operative NMR devices.

b) Superconducting components, however, are extremely sensitive to field changes. Transverse field changes which result from tilting the magnet with respect to the superconductor depend, to first order, on the tilt angle. These transverse field changes produce transverse magnetization of the superconductor which is extremely strong due to the differential diamagnetism (perfect diamagnet: volume susceptibility approximately $-1$ MKS i.e. of the order of approximately $10^0$ MKS which is 7 orders of magnitude stronger than for magnetically compensated materials). Fortunately, the magnetizations which result from the differential susceptibility are proportional to the field change. Although this may result in negligibly small disturbances in the magnetic field when the superconductor cools down, considerable changes of $B_z$ in the sample volume can result with subsequent disturbances in the NMR spectrum in response to subsequent changes in the magnetic field. These depend, to first order, on the tilt angle and are generally very strong.

Longitudinal magnetization can be treated in the same manner. Changes in $B_0$ also produce a considerable change in the longitudinal magnetization of a superconductor. However, this is not relevant in practice for the following two reasons:

i) A 1 G change in the $B_0$ field corresponds, for 10 T, to a change of 10 ppm, which, for protons, is the entire spectrum width. With lock systems which are installed in modern spectrometers, the field is kept constant to approximately $10^{-10}$, which corresponds to $10^{-5}$ G. The longitudinal field (or the field value) does not therefore change to the extent mentioned, which would be disturbing.

ii) Even for larger field changes which can occur e.g. when pulsed field gradients are applied, the critical currents, together with the very thin layer and the resulting small area which is surrounded by induced current, keep the maximum magnitude of magnetization in the z direction to a minimum.

Therefore, if it were technically possible to keep the transverse magnetic field exactly constant to a precision of approximately 1 G, the additional static field disturbances produced by the magnetization of superconducting RF coils could essentially be eliminated.

However, the problem of stabilizing the magnetic field (i.e. of the transverse component $B_T$) can be solved. As shown below, passive and active devices are, in principle, suitable therefor.

In a preferred embodiment of the inventive NMR spectrometer, the stabilization device has a normally-conducting, preferably cooled, transverse field shield optionally containing additional superconducting components and surrounding the circumference of the RF resonator, which is rigidly connected thereto to control relative tilting and preferably to prevent tilting to at least attenuate the transverse magnetic field components $B_T$ which act on the RF resonator.

The high-frequency disturbances can thereby be filtered out in a very simple fashion. This can be applied in a very useful manner without any further measures, since vibration-caused disturbances which produce field modulation and spectral disturbances can be filtered out. This might be the only reasonable way to deal with such high-frequency disturbances, since the compensation methods mentioned below are too slow. This embodiment is also ideal for supplementing the active compensation methods in the high frequency range (e.g. in the region over 10–100 Hz) to thereby obtain overall broad-band stabilization, in the entire range of 0 Hz to infinity. Moreover, such a shield has no disadvantages, not even with respect to shimming, since the response is only somewhat slowed, but all shim functions are maintained.

In a further advantageous embodiment of the invention, the stabilization device has a superconducting transverse field shield which is flat, sheet-like, or which consists of discrete wire-shaped or layered conductors to surround the RF resonator circumference, and which is rigidly connected thereto in a fashion controlling the relative tilt, in particular in a non-tilting manner to keep the transverse magnetic field component $B_T$ acting on the RF resonator constant.

This type of shield can carry persistent currents. In principle, it is therefore suitable for shielding any low frequencies down to zero. In the ideal case, implementation of such a shield obviates the need for any further measures, even active ones. However, problems with shimming and $B_0$ control (lock) could occur. The arrangement is somewhat complex due to its cooling and must be independent of the SC coil for complete freedom of control. It is questionable whether the shim values can be maintained with sufficient accuracy after cooling below the transition temperature. Moreover, in this embodiment, subsequent shimming is usually not possible although it may not actually be required.

A particularly advantageous further development of the above-described embodiment is characterized in that the transverse field shield is interrupted in the z direction at one or more points through slits which permit unimpeded passage of the z component of the homogeneous static magnetic field $B_0$. Advantageously, a field lock is operative for such embodiments but shimming is still not possible without further measures (e.g. heating above $T_c$ during shimming or inner shim systems).

A further particularly preferred embodiment of the inventive NMR spectrometer is characterized in that a detection device is provided which measures the transverse magnetic field components $B_T$, and the stabilization device has an active compensation device to which the measured transverse magnetic field components $B_T$ are supplied via feedback or control, wherein the active compensation device keeps the transverse magnetic field components constant in the region of the superconducting components of the RF resonator. This is a very effective and flexible solution which can be realized with appropriate effort, but requires an extremely stable detector and the frequency response has an upper limit.

One embodiment of the inventive NMR spectrometer is also preferred, with which the stabilization device comprise means for rotating the superconducting components of the RF resonator about an axis which is not parallel to the homogeneous magnetic field $B_0$.

Rotation of superconducting components can be used in a very effective manner to generate any desired transverse field in their coordinate system. Compared to field coils, very high $B_T$ components can advantageously be easily obtained and there is no dissipation through the (possibly very high) operating current required for coils. The transverse field is also extremely homogeneous which is not easy to realize for field coils. Tilting is the precisely correct physical response to disturbances which are initially caused by tilting. For thin layered coils which are disposed in one plane or parallel to a plane, one single axis is sufficient which is not perpendicular to this plane and not parallel to $B_0$.

Alternatively, in other embodiments, the stabilization device can comprise a means for rotating the superconducting components of the RF resonator about two axes which are neither mutually parallel nor parallel to the homogeneous magnetic field $B_0$. For superconducting (SC) coils which are not oriented in one single plane, both components of $B_T$ must be controlled. This is easy with the present inventive embodiment. The arrangement, however, is more complex.

In one embodiment of the inventive NMR spectrometer which is also advantageous, the stabilization device comprises one or more magnetic field coils which produce transverse magnetic fields in the region of the superconducting components of the RF resonator. A fast actuator without moving parts can be used. However, the field homogeneity must be initially taken into consideration in the design of the coils.

In a further development, the detection device has one or more Hall probes for measuring the transverse magnetic field component $B_T$. This solution is very simple and inexpensive, but problems with long-term stability, drifts and disturbing temperature coefficients can occur. Moreover, the arrangement requires a current supply which could potentially produce field disturbances.

At least one of the Hall probes is preferably coupled to a superconducting loop in such a manner as to increase the sensitivity of the Hall probe to the transverse magnetic field component to be measured. This also produces increased stability of the arrangement at the expense of greater complexity. The transformer loop must not disturb the $B_0$ field in the region of the NMR sample. A heating means for setting the zero point might also be required. Should the loop "quench" for some reason, the zero point reference is lost.

In one further preferred development, the detection device for measuring the transverse magnetic field components $B_T$ comprises one or more SQUID sensors which are coupled to the transverse magnetic field via one or more superconducting loops. Such an arrangement is extremely sensitive since a SQUID can detect magnetic fields <<1 G.

In one further particularly preferred development, the detection device comprises one or more electrically conducting pick-up loops for measuring the transverse magnetic field component $B_T$ which are periodically tilted and whose induced voltages are evaluated. This arrangement is sufficiently sensitive, utilizes no "exotic" technology and correct operation always ensures an absolute zero position (coil plane exactly perpendicular to $B_0$). The large signal behavior is straightforward to handle. In principle, the zero reference cannot be lost. The $B_0$ field is not disturbed when the amplifier is highly resistive (FET), since a voltage is induced but no current flows. Moreover, the arrangement does not depend on the temperature. Such a detector would therefore appear to be ideal for this application. This additional development is further improved when the pick-up loops are oriented, on average and in the operating position, with their surfaces substantially perpendicular to the homogeneous magnetic field $B_0$. The output voltage in the operating position is then exactly zero. This is advantageous in that possible instabilities in the gain of the amplifier electronics have no negative effect, since the system is always regulated to zero. To obtain the optimum effect, the mechanics should be precisely adjusted.

In a further improvement, the detection device has a means for phase-sensitive detection of the induced voltage in the pick-up loop(s). This permits convenient signal analysis and has the advantage that static zero point drifting in the amplifier electronics is unimportant since the useful signal has been modulated to a frequency other than zero.

To obtain the desired information about the $B_T$ component at the base frequency f, and to distinguish it from the undesired 2 f component originating from the static field $B_0$, the phase-sensitive analysis of the voltage induced in the pick-up loop should occur at the base frequency of the tilt motion.

Increase of the useful signal at f with simultaneous reduction of the disturbing signal at 2 f results when two or more oppositely periodic tilted pick-up coils are switched such that the $B_T$ signal components add.

This further development can be improved to an even greater extent when the oppositely tilted coils are dimensioned and operated at tilt amplitudes and switched such that the signal components produced by the homogeneous magnetic field $B_0$ cancel with as great an accuracy as possible. This produces an increase in the useful signal at f with simultaneous elimination of the disturbing signal at 2 f. This permits a higher tilt amplitude and therefore a larger useful signal to improve the sensitivity and stability.

In a fundamental embodiment for detecting the two required $B_T$ components, each of the degrees of freedom associated with the transverse magnetic field components $B_T$ has one pick-up coil, one coil pair, or one coil system having several pick-up coils.

Alternatively, the two degrees of freedom which are associated with the transverse magnetic field components $B_T$ may have only one single pickup coil, one coil pair or one coil system which is periodically tilted about two non-parallel axes. This eliminates one coil.

This can be improved when the tilt motions are temporally phase-shifted, preferably by 90°, with analysis of the induced voltage being effected by two phase-synchronous detectors whose reference phases are also mutually phase-shifted and synchronized with the tilt motions. This is probably the simplest way to separate the two signals when the same frequency is used for both tilt axes. Only one frequency is thereby required, however with both phases.

High accuracy and long-term stability can be achieved in a further development with which the detection device comprises an NMR transmitting/receiving system for measuring the transverse magnetic field component $B_T$ which determines the absolute value of the magnetic field in the measuring volume through determination of a nuclear resonance frequency and, by means of neighboring superconducting structures, converts transverse field component changes $dB_T$ into longitudinal field component changes $dB_0$. The SC structure may be disposed on the same substrate as the SC coil itself. This permits highly precise measurements.

In another advantageous further development, the transverse field component changes $dB_T$, which act on the detection device, largely correspond to those which act on the superconducting components of the RF resonator and a regulating means, preferably a PI or PID regulator is provided which continuously regulates the transverse magnetic field components $B_T$ which were measured with the detection device, preferably to zero.

In one further advantageous development, the detection device is disposed outside the range of the compensation device and the compensation device is controlled in correspondence with the measured transverse field component such that the transverse magnetic field components $B_T$ are held constant in the region of the superconducting components of the RF resonator. If space is a problem, the detector can be disposed further away from the SC coil.

If there is enough space for the detector, the correct transverse field components $B_T$ can be measured by disposing the detection device in the direct vicinity of the superconducting components of the RF resonator.

In one advantageous embodiment of the inventive NMR spectrometer, the detection device is disposed in the direct vicinity of the magnetic center of the magnet arrangement producing a homogeneous static magnetic field $B_0$, in particular within a region with $|dB_0/dz|<100$ G/mm. If the field is inhomogeneous, the measurement of $B_T$ depends on the exact location of the detector. This can produce measuring errors which the above embodiment eliminates. However, there must be sufficient space in that region.

In a further advantageous embodiment, the detection device is disposed radially outside of a gradient system. This reduces the influence of the gradient fields although the detection device is still disposed very close to the SC coils. Space must be provided radially about the gradient coils.

Advantageously, a shielded gradient system is used such that the influence of gradient fields can be neglected.

In a further preferred embodiment, the detection device is disposed on the magnet axis or is composed of several partial detectors disposed about the z axis in such a manner as to effectively measure the transverse magnetic field components $B_T$ which occur on the z axis. Since the detector cannot be disposed at the exact location of the SC coil, the best approximation of $B_T$ at the location of the SC coil is determined through averaging of the individual measurements.

When the SC coil is tilted, small lateral shifts occur which could lead to mechanical collisions and limitations of the possible tilt angles. In an advantageous embodiment, the axes of rotation of the compensation device extend through the superconducting components of the RF resonator.

In a further embodiment, the rotary axes of the compensation device can extend through the detection device. The detector is thereby not displaced during the regulation processes and no additional measuring errors are introduced which could impair the quality of regulation.

In one highly preferred embodiment of the inventive NMR spectrometer, the compensation device has further signal inputs for carrying out additional corrections of the transverse fields which are caused by further influences, in particular mechanical creeping or thermal deformation of components. This facilitates compensation of known artefacts, of malfunctions, and allows fine tuning.

Advantageously, the compensation device can have one or more piezo actuators for tilting the superconducting components of the RF resonator. The piezo actuators function in the magnetic field, but produce no magnetic field disturbances. The working stroke should be sufficient for the small tilt angles. There is no power input in the rest position.

In a further preferred embodiment, the compensation device has one or more conductor loops for tilting the superconducting components of the RF resonator which are fed with currents generated by a control electronics and which are moved in the magnetic field through Lorentz forces. Nearly any arbitrary stroke can be realized, the solution is inexpensive and high voltages as e.g. with piezo actuators are not required.

A method for operating an inventive NMR spectrometer is also within the scope of the present invention, with which the disturbances are evaluated taking into consideration known influences produced by a shim system to thereby optimise control of the transverse field components.

In one advantageous method for operating an inventive NMR spectrometer, the additional fields generated through changes of the setting of the shim system are included in the correction.

In a further preferred method variant, the disturbances are evaluated taking into consideration known influences produced by a gradient system. Regulation of disturbances caused by the gradient system can thereby be prevented, should they not be sufficiently minimized through structural design measures.

In an improvement of this method variant, the additional fields, which are generated by gradient switching are taken into consideration in the correction and/or no corrections are made during the gradient switching times. "Blanking" is the simplest possibility to eliminate the above-described disturbances. A digital interface is required, but without calibration.

In a further preferred method variant, the compensation device is already activated before or during cooling of the superconducting component of the RF resonator and remains activated during cooling below the transition temperature $T_c$. In this manner, not only are subsequently generated shielding currents in the SC resonator prevented, but their generation is blocked right at the outset. The resonant coil arrangement is preferably suited for this type of operation, since its function does not depend on the temperature, because detectors and actuators are used which are already active above the transition temperature $T_c$ of the SC coil and which have the required accuracy throughout the entire temperature range.

In an alternative method variant, the compensation device is switched on at any time, in particular after demagnetisation of the superconducting components of the RF resonator to keep the $B_T$ fields which are applied at this time, constant. Once a disturbance-free state has been reached (in any manner whatsoever), it can be "frozen".

In a final particularly preferred method for operating an inventive NMR spectrometer, in addition to active control, the high-frequency transverse field components are simultaneously attenuated with a transverse field shield. Coupling of the passive and active methods is thereby very advantageous to increase precision and/or considerably reduce disturbances which cannot be controlled or which impair regulation.

Regulation must prevent deviations of $B_T$ exceeding a certain maximum value since otherwise the SC resonator is irreversibly magnetized when its critical current is exceeded and must then be either demagnetised or heated. The critical current could be exceeded in response to any short, irregular excursions, e.g. a jolt. If real time regulation cannot be effected with adequate scope and speed, this will invariably happen. Therefore, a normally conducting shield is very valuable as a supplement, since it prevents uncontrolled rapid $B_T$ field changes. Large $B_T$ changes actually pass through but with a limited rate of change such that regulation/control can follow it.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and is explained in more detail by means of embodiments.

BRIEF DESCRIPTION OF THE DRAWING

FIGS. 16a–f show an analysis of the function of a detector arrangement with induction loop;

DESCRIPTION OF THE PREFERRED EMBODIMENT

The present invention concerns the field of nuclear magnetic resonance (NMR), and in particular the magnetization and magnetic conditioning of superconducting RF coils for receiving RF signals from a sample.

Figure 2:
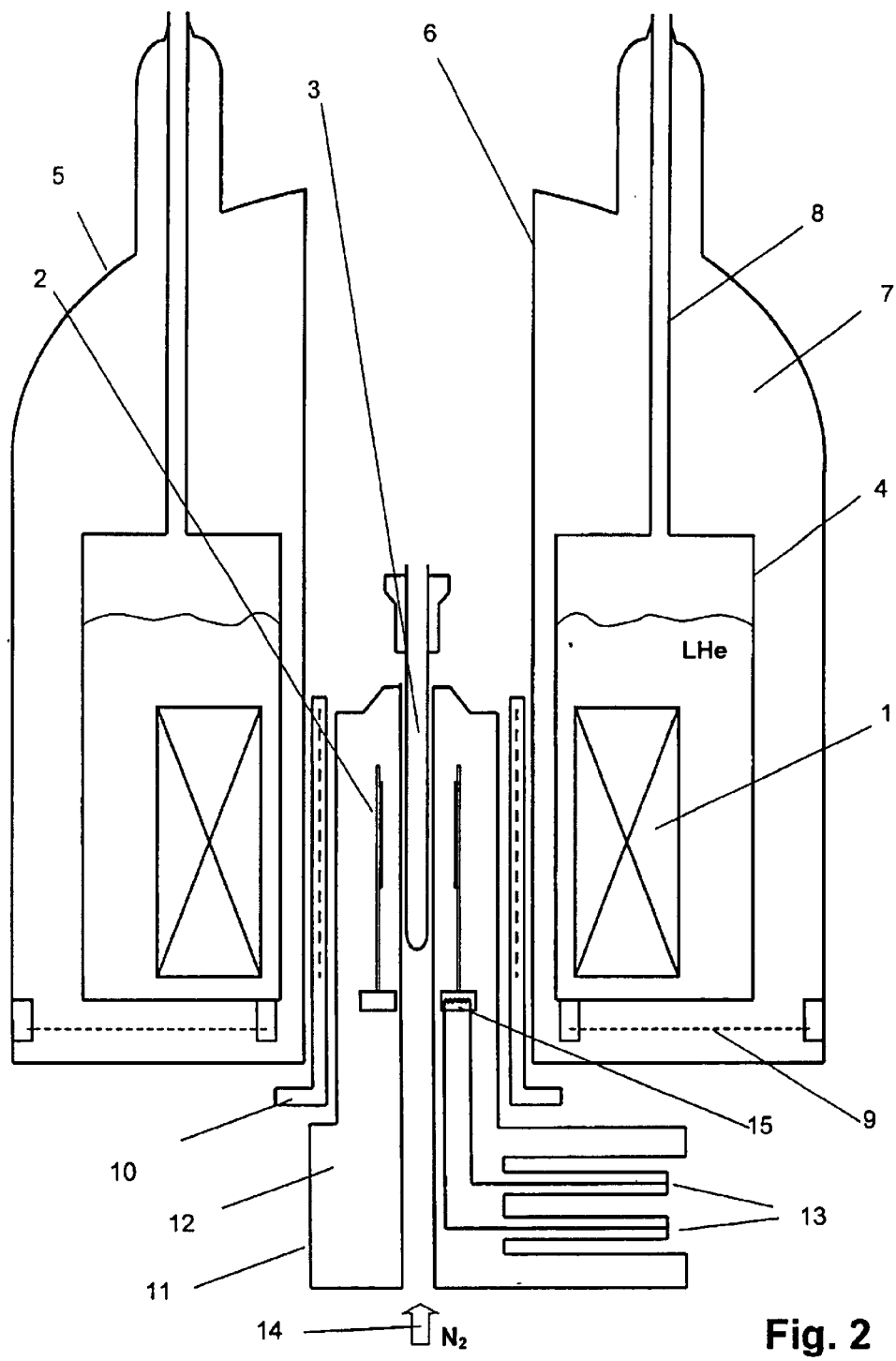
FIG. 2 shows a schematic vertical section through an NMR spectrometer with superconducting magnet coils and a cryostat according to prior art.

FIG. 2 schematically shows a vertical section of an NMR spectrometer according to prior art which contains main field magnets 1 for generating a homogeneous static magnetic field $B_0$ in the direction of a z axis, and a high-frequency (RF) resonator 2, having one or more superconducting components, for receiving NMR signals from a measuring volume with a sample tube 3.

The magnet arrangement 1 may comprise one or more superconducting coils which are housed in a liquid helium container 4 within a cryostat 5 having a room temperature bore 6. To keep thermal conduction as small as possible, the container 4 is disposed in an insulating vacuum 7 within the cryostat 5 by means of a vertical suspension 8 and a lateral suspension 9. The arrangement also comprises a shim system 10 and a probe head 11 which houses the RF resonator 2. Cooling lines 13 are guided through an insulating vacuum 12 for cooling the SC elements of the RF resonator 2 via a heat exchanger 15. Finally, the arrangement has a feed line 14 for feeding temperature-controlled air to the sample tube 3 in the probe head 11.

It is the purpose of the present invention to essentially eliminate the disturbances to the static magnetic field caused by all known superconducting RF coils and the resulting artefacts in the spectra, or to considerably reduce them compared to prior art and keep them low during their entire time of operation.

This is effected through extremely precise control of the transverse magnetic fields acting on the superconducting RF coils 2. This can prevent the occurrence of disturbing magnetization from the outset. Moreover, the inventive device can guarantee disturbance-free long-term operation. This is achieved through active control of the transverse field components and/or their passive shielding using normally or superconducting shields.

A. Passive Shielding

Figure 20:
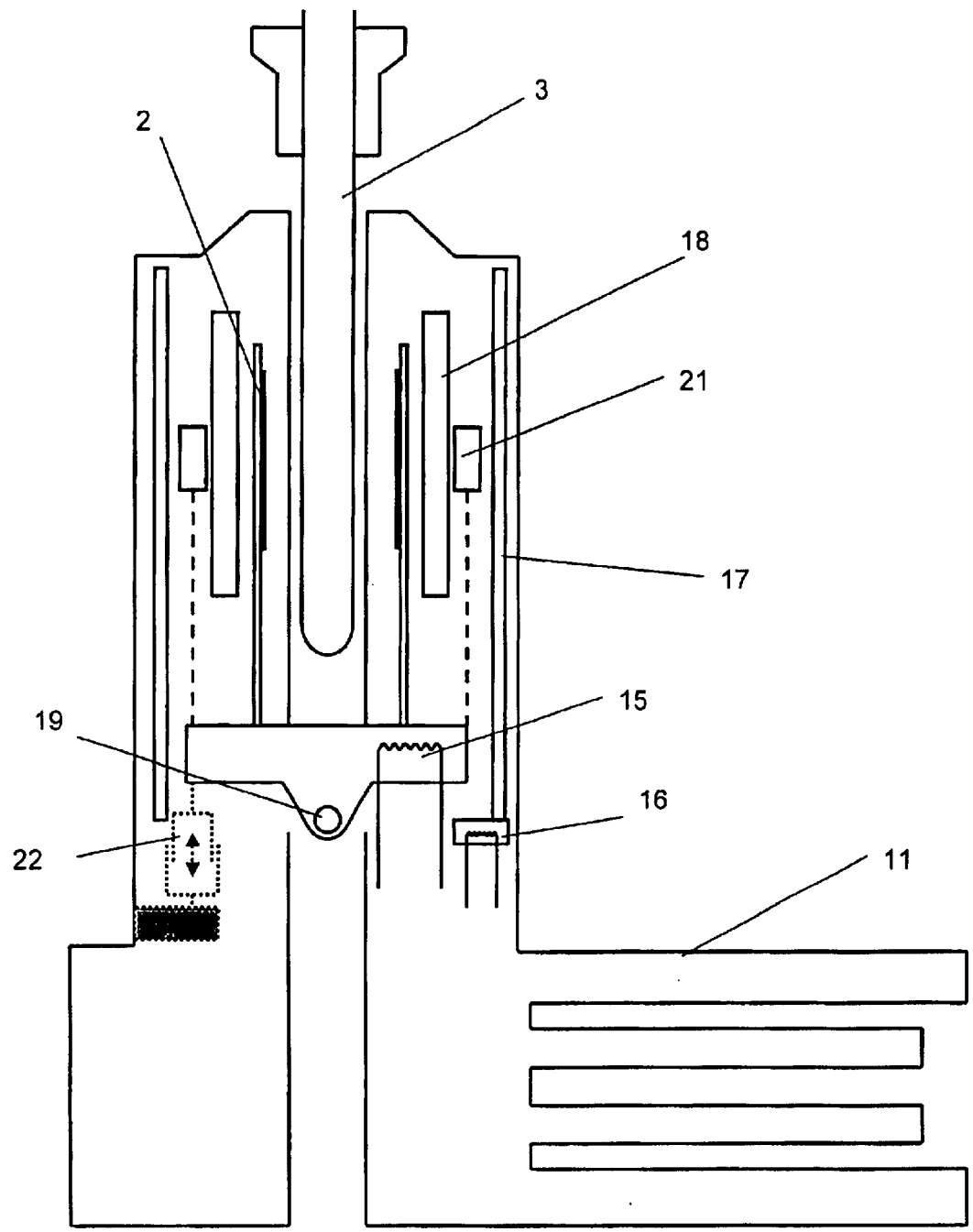
FIG. 20 shows a schematic vertical section through a transverse field shield.

Including devices such as:

a) shielding of the probe head with a superconducting shield which is initially rigidly coupled to the RF coils of the RF resonator 2 in a purely passive arrangement. The first possibility is to install the shield 17 directly in the probe head 11. FIG. 20 shows a possible arrangement of a shield 17 cooled by a cooling device 16 in the probe head 11. An optional gradient system 18, an optional magnetic field sensor 21, as well as an optional axis of rotation 19 are provided radially within the shield 17.

This is disadvantageous in that i.a. shimming cannot pass through this shield 17. To overcome this problem, the shield 17 must be thermally designed such that it can be cooled as desired below $T_c$ irrespective of the coil, and thereby freeze the inner field or also become magnetically permeable for shimming, by heating above $T_c$.

The second possibility is to locate the shield 17 outside of the shim system such that it can be heated at any time above its $T_c$ and then cooled below $T_c$ should larger shim changes or recharging of the magnet be required.

Positioning of the shield 17 outside of the shim system can produce tilts of the shield 17 with respect to the SC coils of the RF resonator 2 depending on the mechanical rigidity of the entire arrangement, since the shield 17 actually assumes the function of the magnet with respect to the enclosed field. Such a shield may be suspended with much more rigidity than the magnet itself due to its small dimensions.

b) A further embodiment is a shield 17 of a normally-conducting material which is disposed about the SC coils of the RF resonator 2 and which is initially rigidly mechanically connected therewith in a purely passive arrangement. Although a normally conducting shield cannot block the DC components of a transverse field change, it can attenuate high-frequency vibrations and transient effects. Particularly when the shield is cooled to low temperatures, it can constitute a very effective low-pass filter for the transverse fields (since the electric conductivity of e.g. Cu increases typically by a factor of 100 with respect to room temperature) such that effects which result from e.g. vibrations of the magnet are filtered very effectively. A gradient system 18, a magnetic field sensor 21, and an axis of rotation 19 can optionally be provided, radially within the shield 17.

Figure 21A:
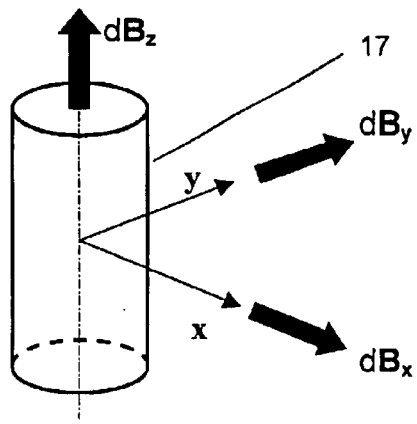
FIG. 21a–f show embodiments of the transverse field shield of FIG. 20.
Figure 21D:
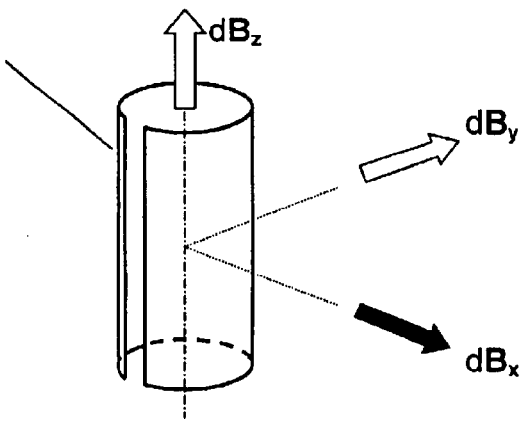
Figure 21B:
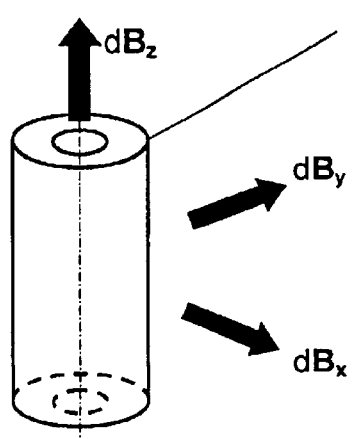
Figure 21E:
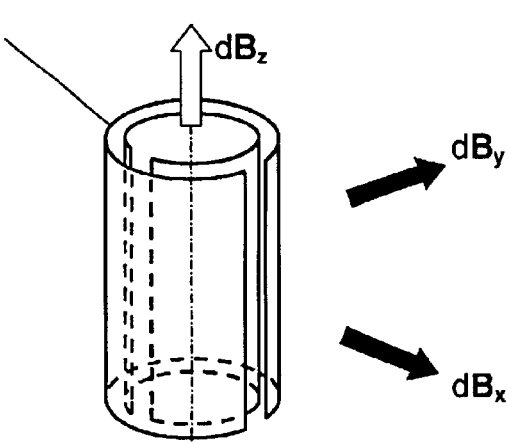
Figure 21C:
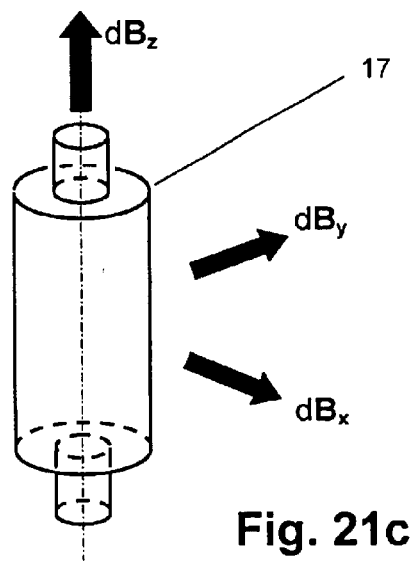

FIGS. 21a to f show embodiments of the shape of such shields according to point a) or b). FIGS. 21a to c show the simple variants with increasing shielding effectiveness. It should be noted that the narrower the ends, the less the field changes which can penetrate from those ends. However, in any event, there must be openings for the sample itself and for the temperature-controlling air.

Figure 21F:
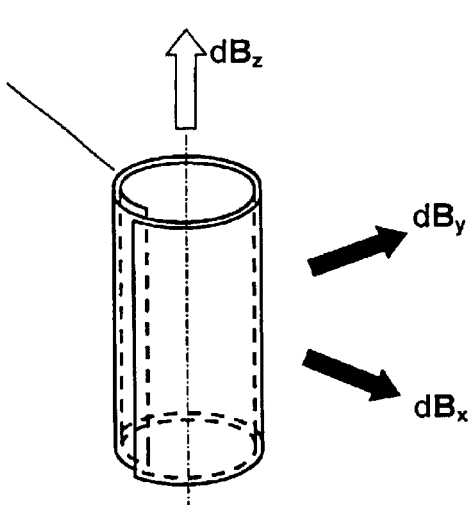

FIGS. 21d to f finally show different slotted variants which prevent or filter penetration of transverse fields $B_T$ and while permitting change of the static field $B_0$. This might be required when the samples are changed to control the exact resonance frequency for samples having different magnetic susceptibility and also permits normal operation of the lock system. In FIG. 21 those components of the field changes which are damped are characterized with a black arrow for reasons of clarity.

c) A mechanical orientation of the NMR coils e.g. on a magnetic needle which orients itself parallel to the magnetic field, is not possible since the field of the magnetic needle destroys the homogeneity of the NMR $B_0$ field and due to the very small effective force. The accuracy of such a system is therefore more than questionable and it will not be discussed in greater detail.

B. Active Shielding

Systems of this type measure the actual transverse components and correct them with an active regulation device. These systems are preferred since they are technically easily realized, as shown below. A system of this type is also very flexible in its implementation and operation. For this reason, the major part of the description of the present invention concerns the active variant with which an occurring disturbance is measured and compensated for by a compensation device before significant disturbances in the NMR spectrum occur.

The compensation device can be easily realized through active mechanical tilting of the superconducting RF coils or through additional transverse field coils. Other variants are also possible, with which the orientation of the entire NMR magnet coil is controlled.

The difficulty with an active arrangement is to find a suitable detector to measure the extremely small transverse fields in a sensitive and stable fashion. The feasibility of the active realization of the present invention is closely linked to the feasibility of a sufficiently good detector. Such a transverse field detector is schematically shown in the various embodiments of FIGS. 13a through d.

Figure 1:
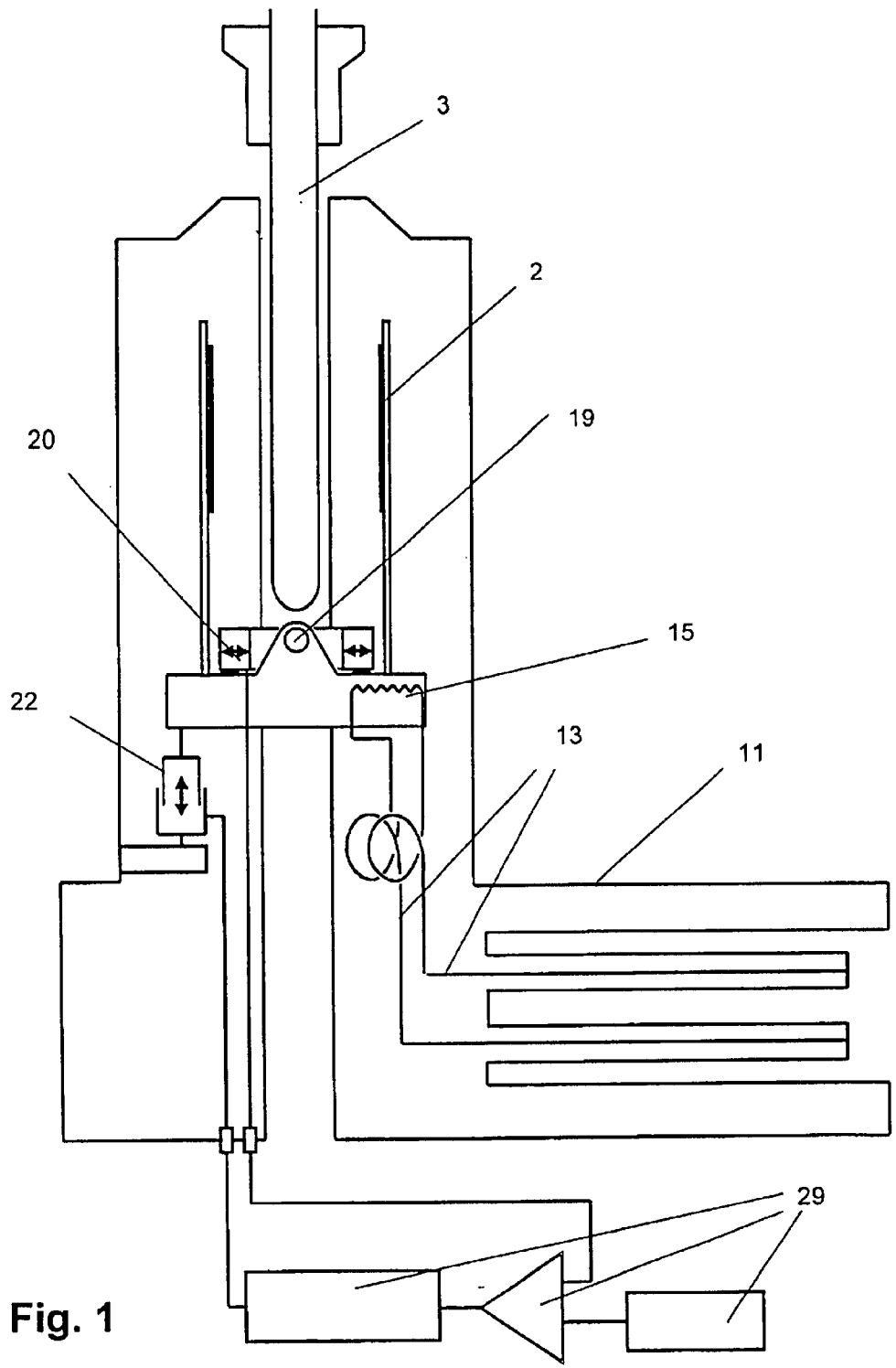
FIG. 1 shows a schematic vertical section of the inventive device.
Figure 13A:
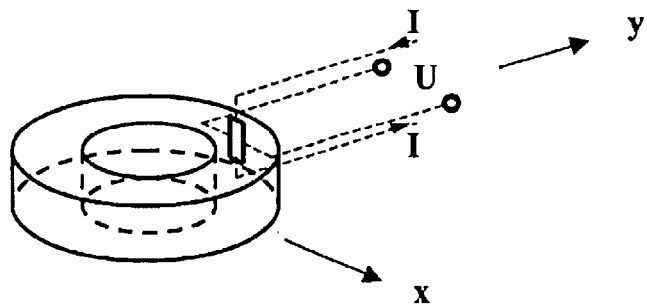
FIGS. 13a–d show schematic arrangements of an inventive detection device in several embodiments.
Figure 13B:
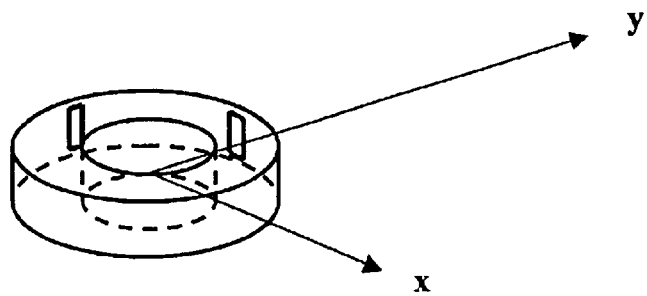
Figure 13C:
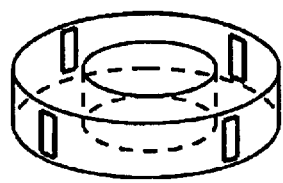
Figure 13D:
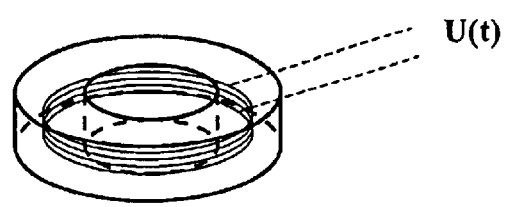

For consistency, the detector is always represented as a toroid, which, in the simplest case only contains e.g. a Hall probe which measures a component (e.g. $B_y$) of the transverse magnetic field (FIG. 13a) with the toroid being disposed about the symmetry axis of the probe head 11 (see e.g. transverse field detector 20 in FIG. 1). The inner implementation can be realized in completely different ways, e.g. having two or four Hall probes (FIGS. 13b, 13c) or an oscillating pick-up coil (FIG. 13d, see below).

The detector must not necessarily be installed in the probe head itself but can, in principle, be placed at any position in the NMR system where the relationship between the orientation of the NMR coils and the detector is defined. In particular, the detector itself can be implemented as part of the shim or even the magnet system.

Surprisingly, such an extremely precise detector which meets all requirements can be realized as is illustrated by way of example below. An embodiment of such a detector for transverse field components (oscillating coil) can be exactly analysed. This embodiment shows that it is technically possible to construct a device (called "detector") for measuring transverse field components to an accuracy of <1 G in the presence of a very strong longitudinal static magnetic field (>100000 G) and in a long-term, stable fashion.

Brief remarks concerning the technical realization of such a detector:

1. Simplest Embodiment

Figure 15A:
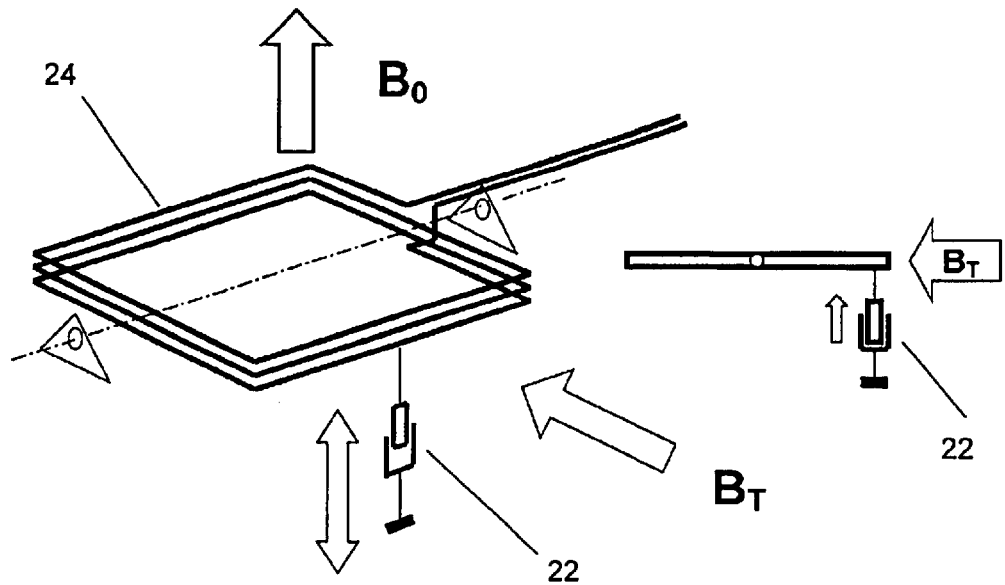
FIG. 15a shows the basic arrangement of a detector with induction loop.

A detector is schematically shown in FIG. 15a. A coil having a surface of approximately 1 cm² which is wound with 100–1000 windings of thin wire is initially oriented with its surface exactly perpendicular to the $B_0$ field. This coil has one or more mechanical actuators 22 which cause it to oscillate periodically about the initial position about one (or two) axes disposed in the coil plane and perpendicular to $B_0$. The frequency of the oscillation can typically be in the region of 1 kHz to 10 kHz. The amplitude may be very small, typically approximately 100–1000 nm. The coil is connected to a sensitive voltage amplifier with a spectral noise density of typically 1 $nV/Hz^{0.5}$.

FIGS. 16a through f illustrate a schematic analysis: FIG. 16a shows periodic tilting alpha(t) of the coil about the y axis with respect to its rest position in a plane xy perpendicular to $B_0$:

Two characteristic signals are produced at the output of the amplifier with different frequencies:

a) longitudinal signal $U_{(z)}$: An extremely small signal with twice the frequency of the oscillation due to the fact that the effective area in the $B_0$ direction decreases with the cosine of the angle of inclination. This produces a time-dependent flux $Phi_z$(alpha) which decreases at both tilt sides (FIG. 16b) leading to an induced voltage in accordance with U=dPhi/dt (shown in FIG. 16c). The amplitude of this signal is extremely small since it depends quadratically on the amplitude of the oscillation.

b) transverse signal $U_{(x)}$: If there are no transverse fields, there is no signal at the excitation frequency (for symmetry reasons) (FIG. 16d). If however, a (even very small) transverse field $B_{Tx}$ is applied (in the direction perpendicular to the oscillation axis and $B_0$) a signal is induced in the coil which depends linearly on the amplitude of $B_{Tx}$. For phase-synchronous detection (with the mechanical oscillation as reference), the phase depends on the sign of $B_T$ (FIG. 16e, or 16f for $B_T$ of negative sign).

In summary, one can conclude that the above arrangement with phase-detection synchronous with the mechanical excitation frequency leads to a signal which is proportional to the transverse field component perpendicular to the tilt axis. Simple calculation shows that a sufficiently large signal (in the order of 100 nV–10 $\mu$V) can be obtained to detect field deviations of 1 G.

This useful signal is superimposed on a background signal derived from $B_0$. It can be easily separated through use of a lock-in amplifier since the background signal has twice the frequency of the useful signal. Since the background signal depends quadratically and the useful signal linearly on the oscillation amplitude, suitable selection of a sufficiently small oscillation amplitude permits reduction of the disturbance by the background signal relative to the useful signal to any desired degree.

2. Improved Embodiment

Since a reduction in the oscillation amplitude also reduces the useful signal, technical reasons preclude a reduction of the amplitude below a certain value. On the contrary, the oscillation amplitude and hence the useful signal should be as large as possible. The disturbance caused by the background signal can be considerably reduced with the following simple trick.

Figure 15B:
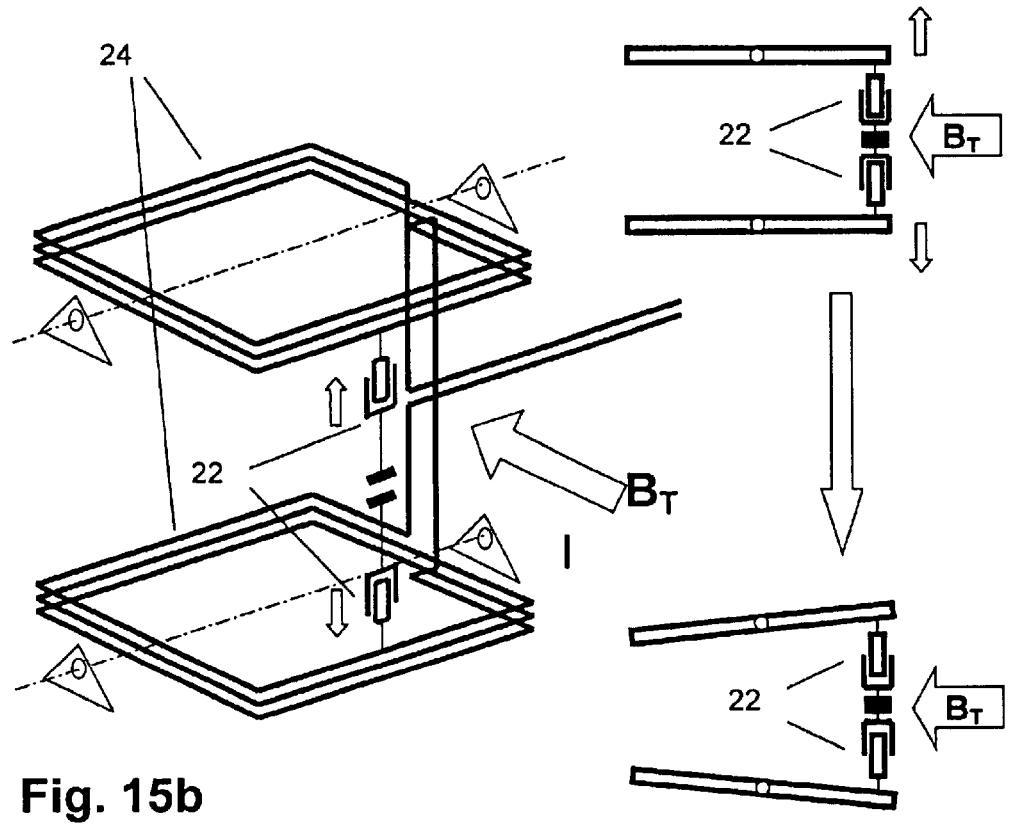
FIG. 15b shows the detector arrangement with compensated influence of the homogeneous magnetic field $B_0$.

An arrangement of two coils is used which are disposed parallel to each other, have parallel axes, oscillate synchronously about these but with opposite phase (FIG. 15b). The outputs of the two coils are connected in series and supplied to the amplifier. The polarity of the series connection is selected such that the transverse signals add.

A simple analysis shows then that in an embodiment wherein the surfaces and amplitudes (i.e. more precisely their product) are equal, the $B_0$ background contribution signal is exactly and simultaneously subtracted. This can now be used to considerably increase the oscillation amplitude. Thereby, the useful signals (derived from the transverse field $B_T$) become much larger without disturbing the analysis through contributions from the $B_0$ field at twice the frequency.

3. Measurements of the two Transverse Components

Figure 17A:
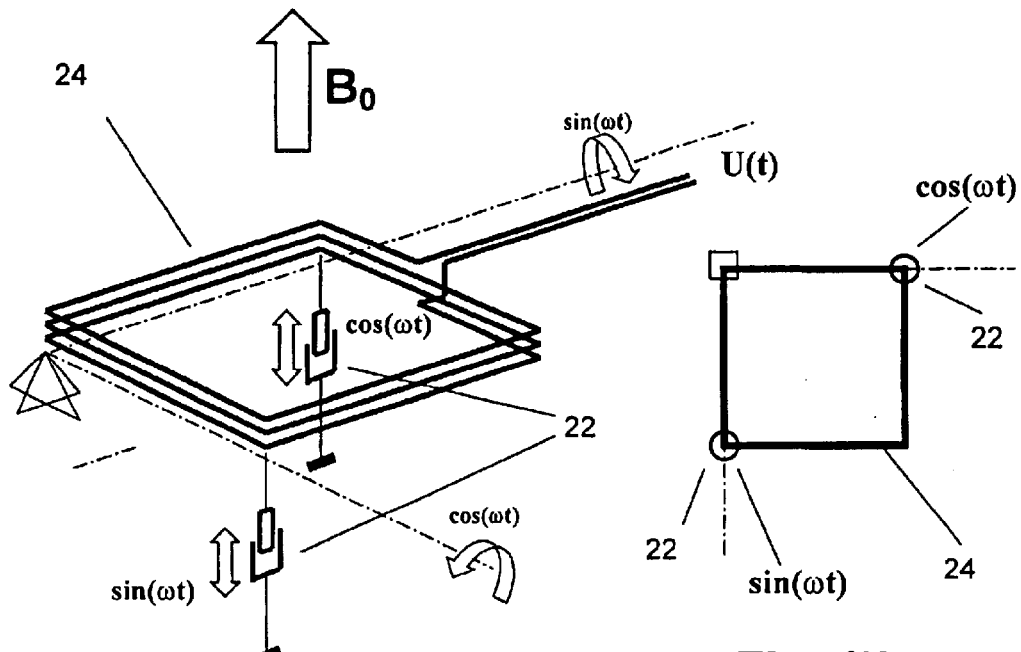
FIG. 17 shows embodiments of a detector arrangement with induction loop and 2 detecting directions, in a) asymmetrical and b) symmetrical arrangement.
Figure 17B:
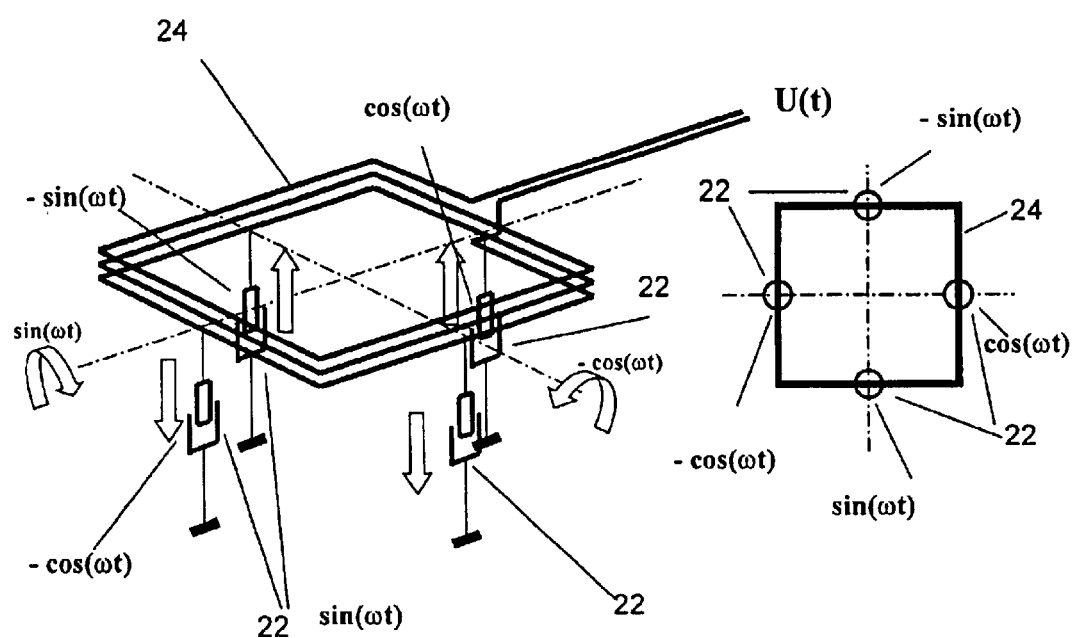

The above arrangements can be used to measure one transverse component $B_T$ e.g. $B_x$. It is generally desirable to also measure the other component, $B_y$. This can be effected in different ways:

a) Two sets of coils are used (according to section 1 or 2 above), one coil set having its tilt axis/axes parallel to the y axis (to measure the $B_x$ component) and the other having its tilt axis/axes parallel to the x axis (to measure the $B_y$ component).

b) The hardware requirements are substantially simplified when the coils according to 1 or 2 are provided with two mutually perpendicular axes of rotation (e.g. like a universal joint). Simpler embodiments without universal joint are shown in FIGS. 17a and b. The coils are tilted simultaneously about both axes but with a phase shifted by 90 degrees (a type of wobbling). The voltages are measured by a double lock in amplifier which separately evaluates the two phase components in 0 and 90 degrees from which the two signals $B_x$ and $B_y$ are obtained. This arrangement is advantageous in that only one set of coils and one amplifier and only one signal path are required and space and costs are reduced.

4. Remarks Concerning Stability

Since all of the above signals are modulated onto a carrier frequency, drifts in electronics produce no zero point drifts. In many cases, the tilt device must not have a stable amplitude and amplification gains must not be stable over the long-term, since this is unimportant when used in arrangements with which the signal is regulated to zero. Taken together, this allows extremely good short-term and long-term system stability to obtain and maintain the required absolute accuracy of 1 G on a long-term basis.

5. Further Remarks Concerning the Embodiment

In the above description, the tilts are generated with a special dedicated actuator 22. This is, however, not absolutely necessary. Arrangements are also possible with which the compensation device (see below) can also be simultaneously used for signal generation, using an additional periodic signal.

Figure 14A:
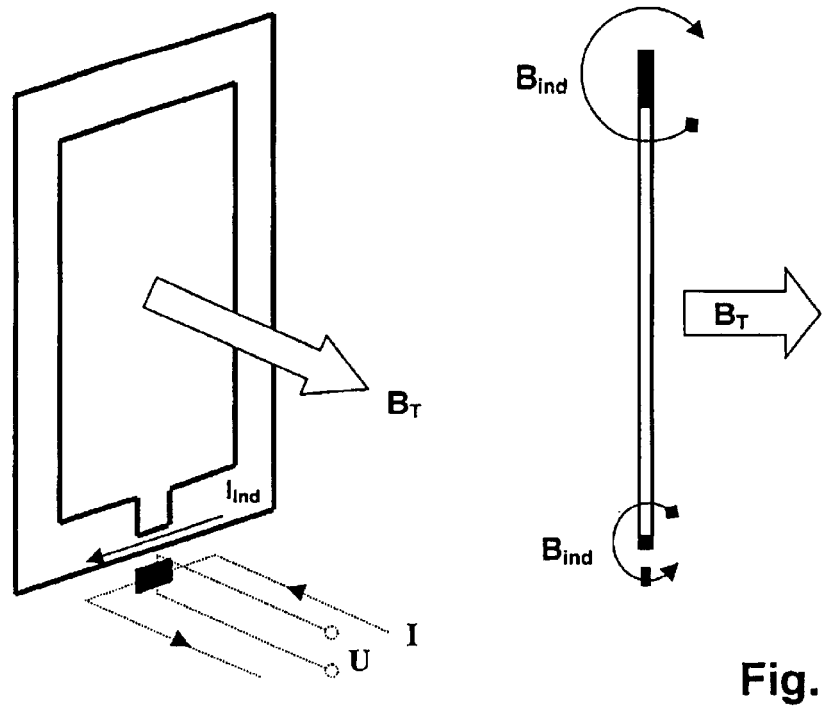
FIGS. 14a,b show the increase in sensitivity of a Hall probe using an SC transformer.
Figure 14B:
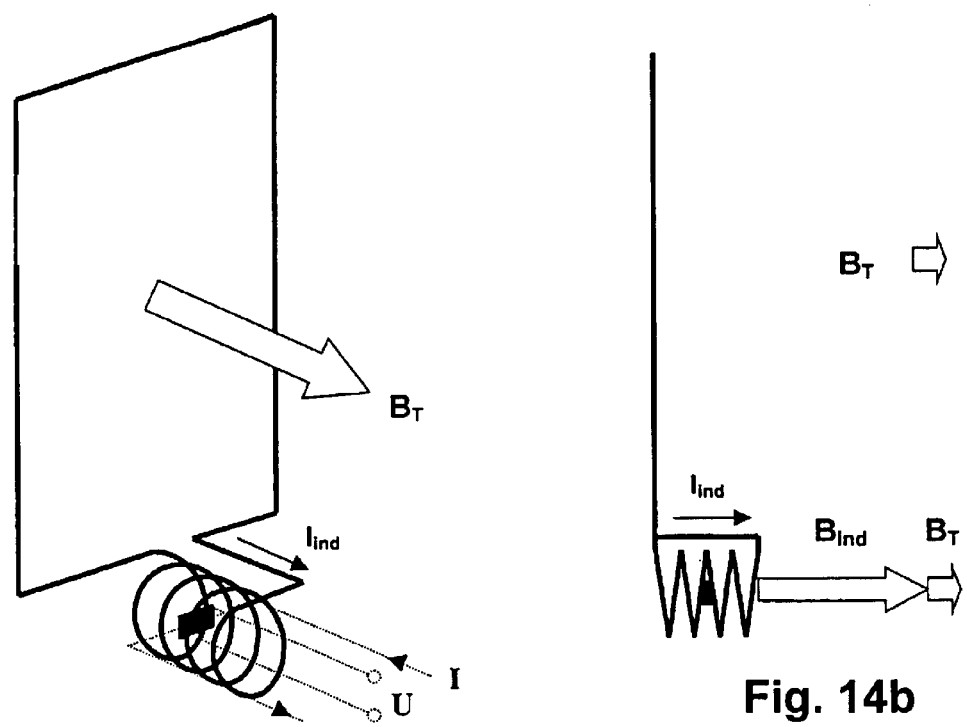

Other technical realizations of a detector for transverse fields are possible such as e.g. a stable Hall probe which is positioned such that its sensitive direction is perpendicular to the $B_0$ field (FIG. 13b) to measure the transverse field component of the magnetic field. Its sensitivity can be further increased if required via a small superconducting transformer (FIGS. 14a and 14b).

Figure 18:
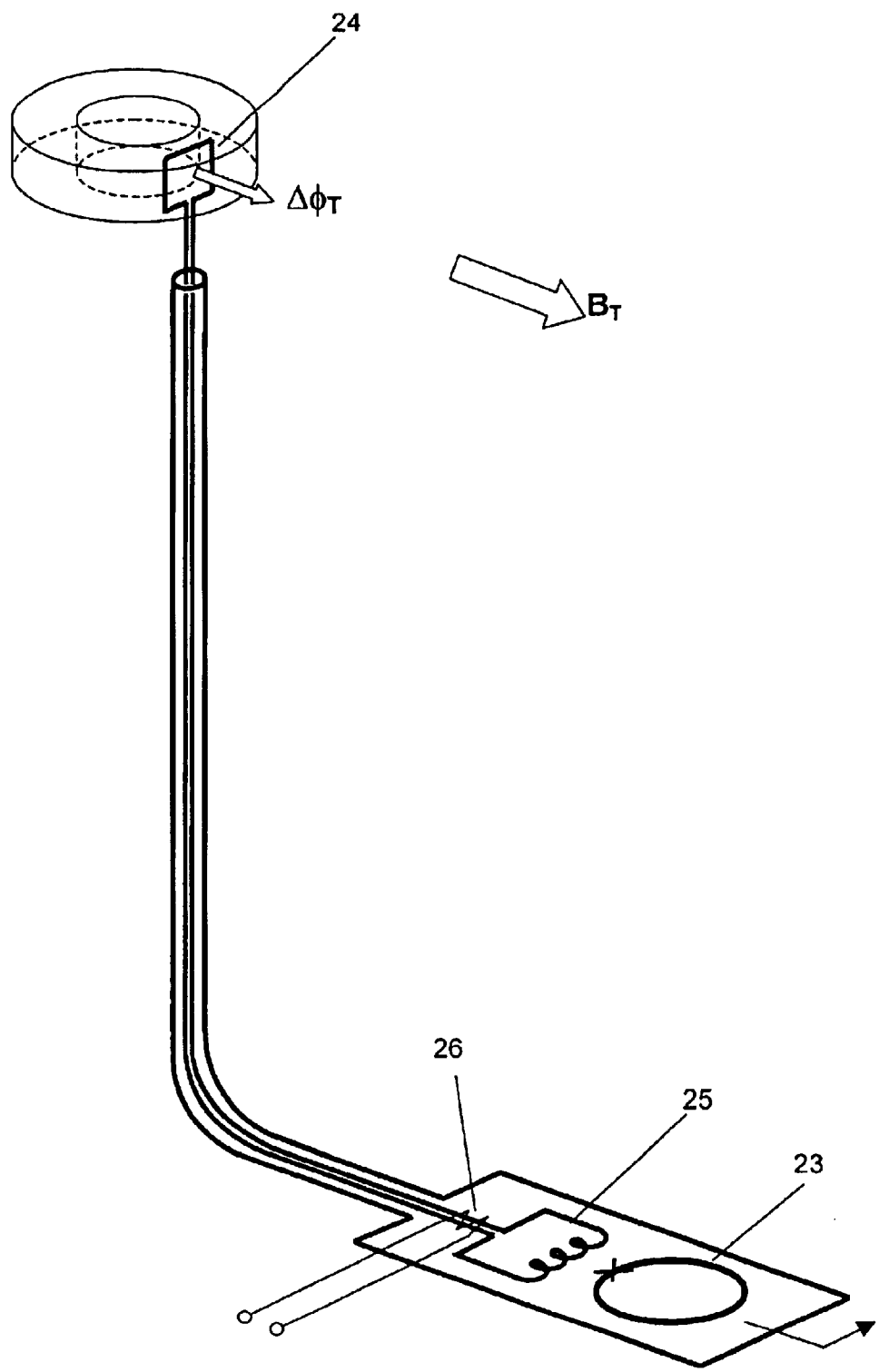
FIG. 18 shows a transverse field detector with SQUID.

Further more demanding methods are also feasible such as e.g. the SQUID detector of FIG. 18 comprising a SQUID 23 and a pick-up loop 24. Since the SQUID ("Superconducting Quantum Interference Device") itself does not function in the magnetic field, a superconducting loop 25 must be used as flux transformer as is usual in applications of SQUIDs for magnetic field and magnetization measurements. The shielded signal line at the superconducting loop 25 lead can be heated with a heating device 26.

It should be noted that the pick-up loop 25 must be oriented perpendicular to the $B_0$ field in the direction of the transverse magnetic field component $B_T$ to be measured.

Figure 19A:
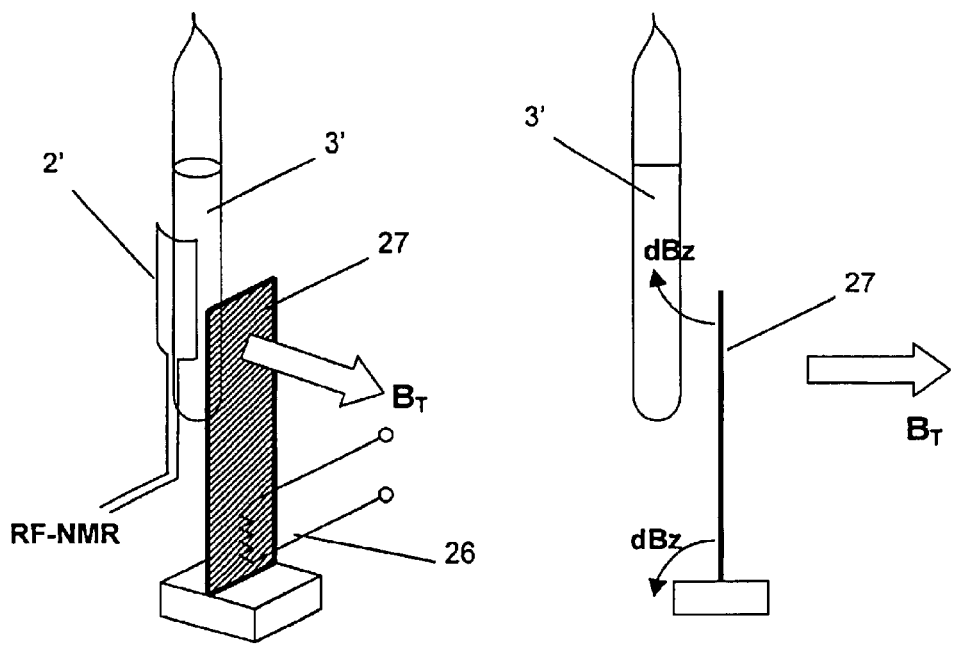
FIG. 19 shows a transverse field detector utilizing NMR signals, and SC element.
Figure 19B:
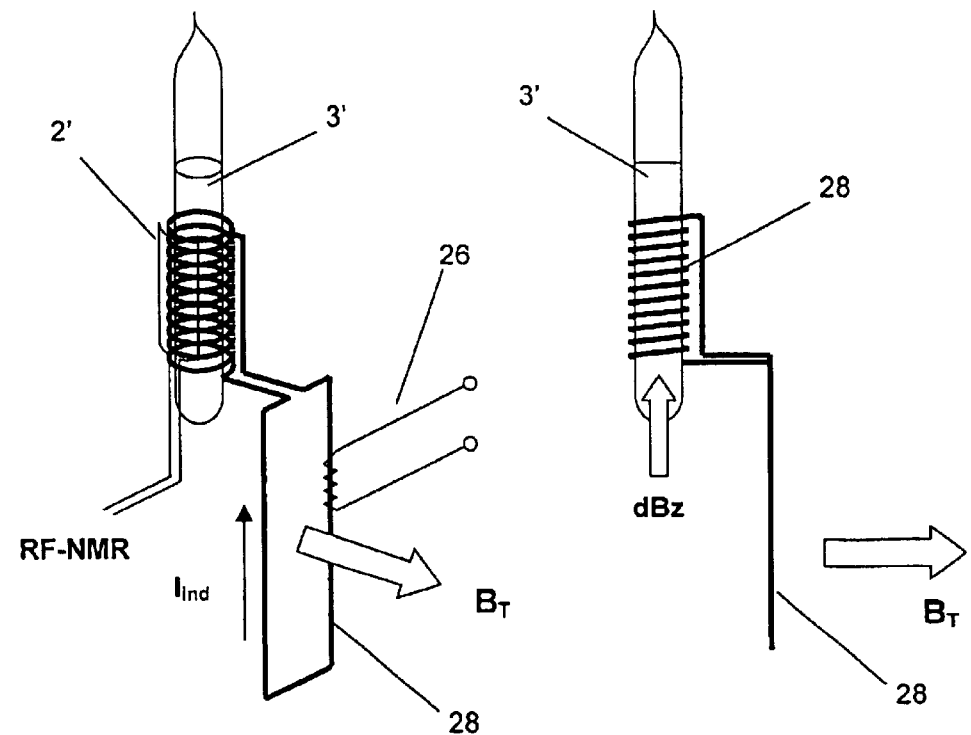

Further embodiments can be realized such as indirect measurement of the transverse field through a small separate NMR sample 3' which is located next to a superconducting element (in FIG. 19a a superconducting surface 27 with suitably positioned discontinuity next to the sample 3' or also a preferably superconducting transformer loop 28 as shown in FIG. 19b) with such a geometry that this superconducting element transforms the transverse field changes $dB_T$ into longitudinal field changes $dB_z$ at the sample location (according to the same principle as the actual disturbing mechanism which is supposed to be eliminated). The NMR resonance frequency of this sample 3' is now measured in a continuous or periodic measurement (analog to the NMR field lock) by means of an RF coil 2' which feeds an auxiliary NMR spectrometer device. The deviation from the desired frequency directly produces a value for the transverse field component $B_T$ which acts in the direction perpendicular to the superconducting surface 27 or loop 28.

The sensitivity of such a system is clearly sufficient, since the same mechanism which causes the undesired disturbances is used for the measurement. Moreover, the sensitivity of such a system can be considerably increased through suitable (as "unfavorable" as possible) geometries of the superconducting element 27, 28.

It should be noted that all embodiments having a superconducting transformation element (FIGS. 18, 19a, 19b and optionally 14a and b), are preferably provided with a small heater 26 to bring the currents in the transformer and therefore the output signals to zero at the nominal position of the system.

Figure 3A:
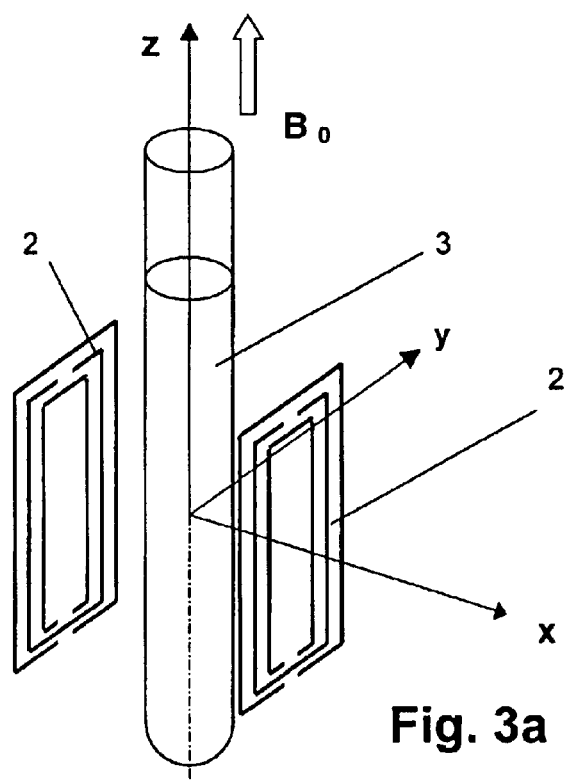
FIG. 3 is an example of a superconducting RF receiver coil arrangement according to prior art, in FIG. 3a in a perspective view and in FIG. 3b as section in the xz plane.
Figure 3B:
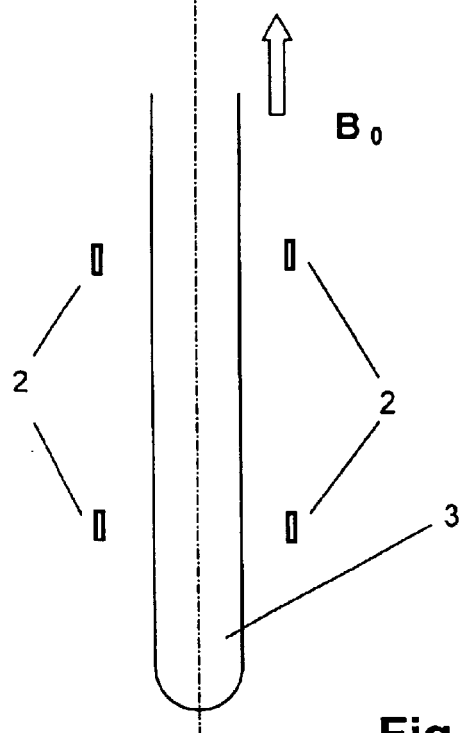
Figure 4:
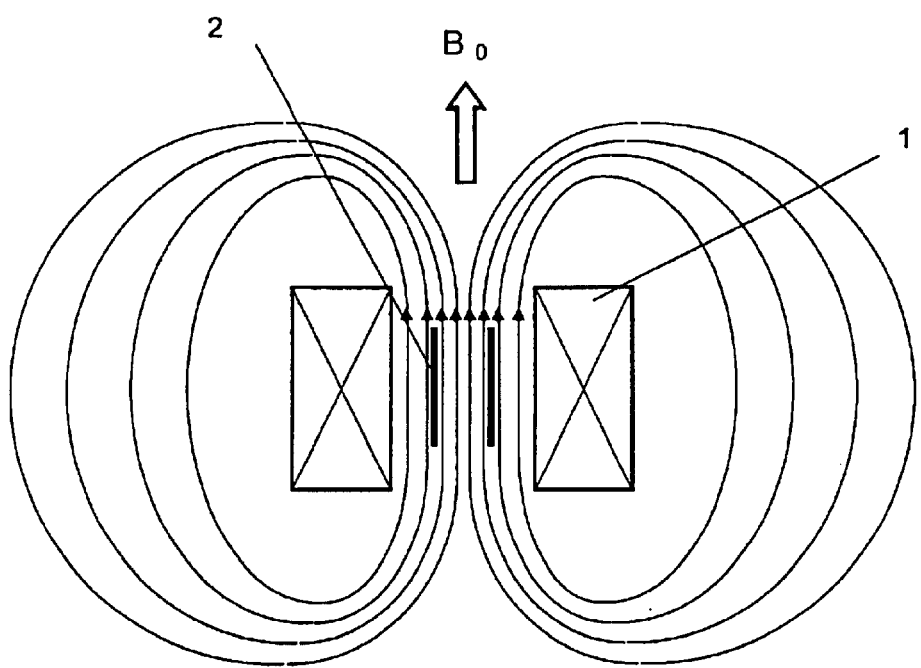
FIG. 4 shows the magnetic field lines of the main field coil when undisturbed.
Figure 5A:
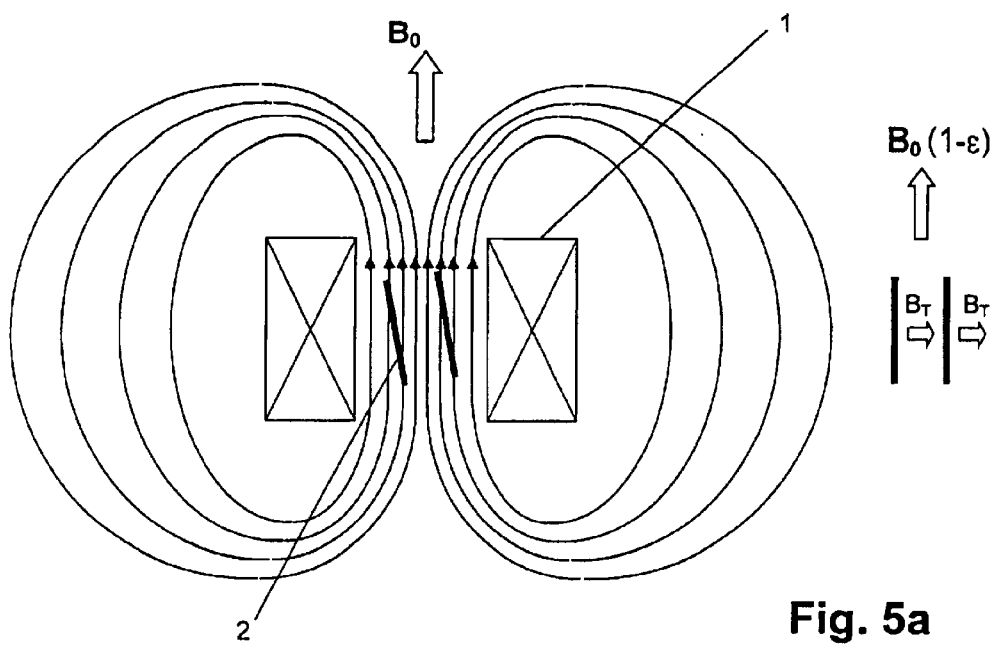
in FIG. 5a through tilting of the RF receiver coil arrangement, and in FIG. 5b through tilting of the magnet coil system.
Figure 5B:
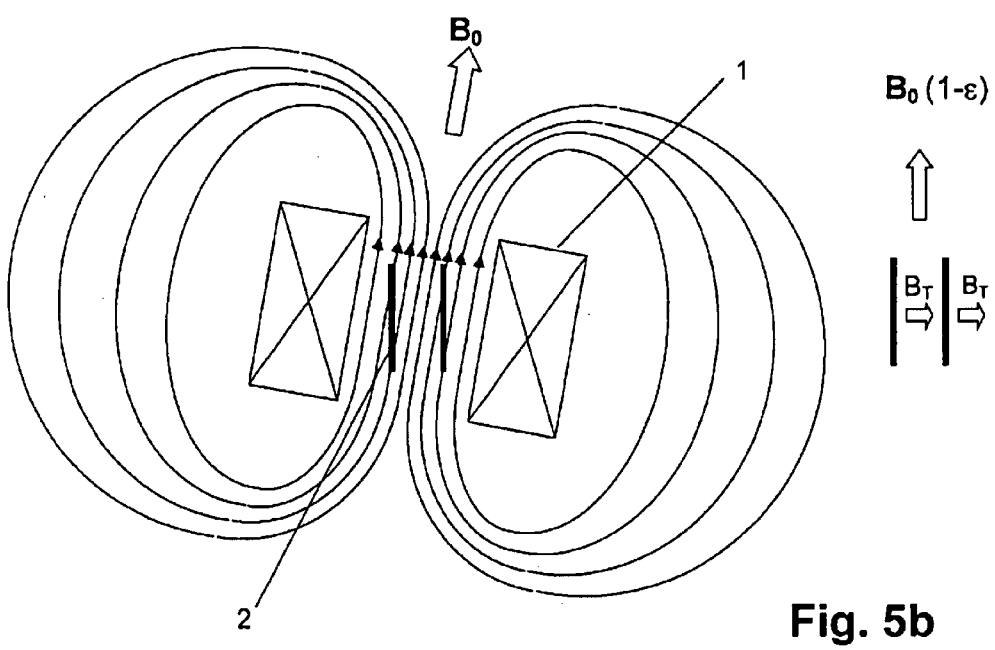
FIG. 5 shows the magnetic field lines of the main field coil when disturbed.
Figure 6A:
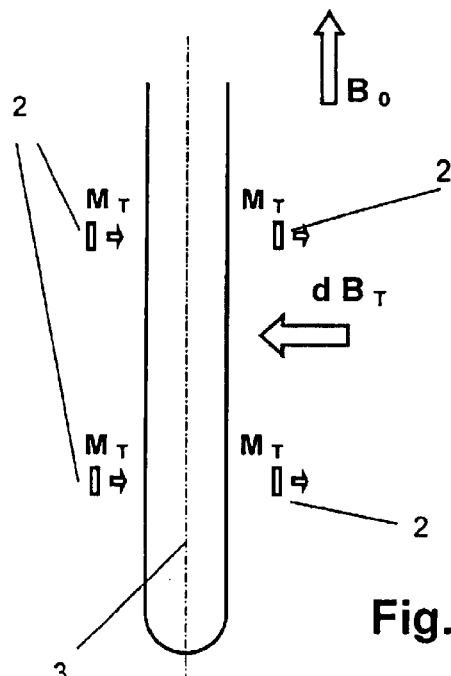
FIG. 6a) shows the transverse magnetization $M_T$ b) the effects of a change in the transverse magnetic field components $dB_T$ on the homogeneity of the magnetic field component $B_z$ at the sample location.
Figure 6B:
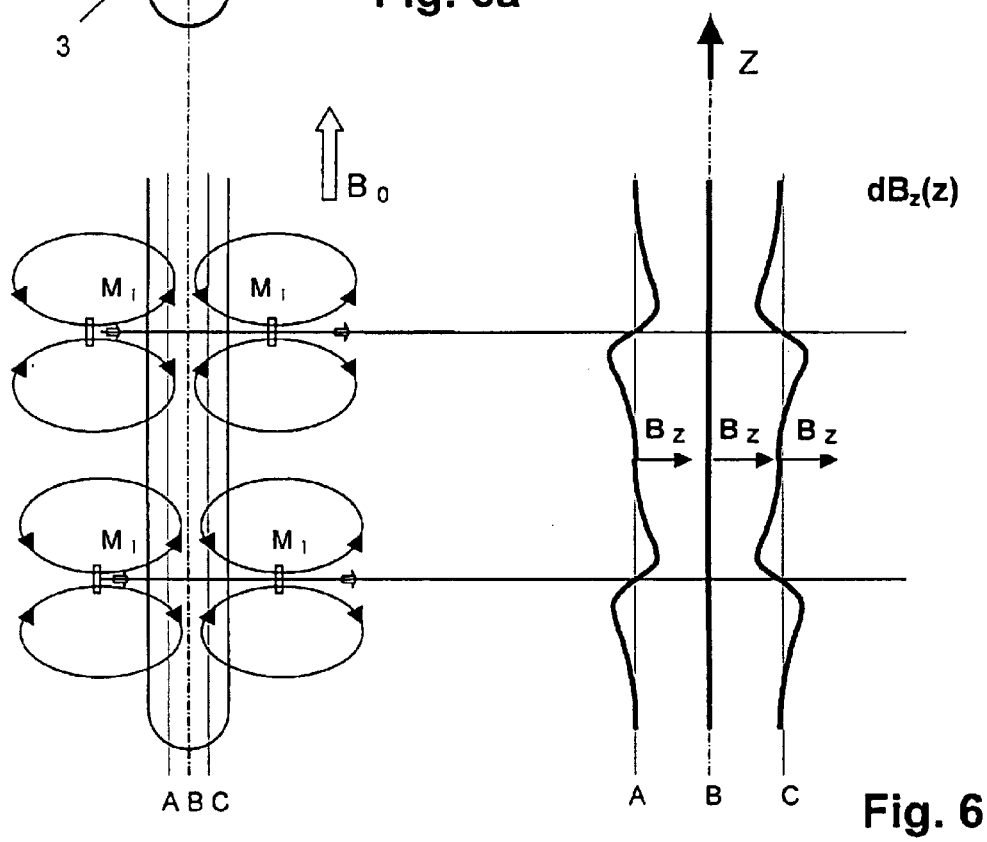

A transverse field detector can be used in one of the above or other feasible embodiment variants, to measure one (e.g. $B_x$) or both (e.g. $B_y$) components of the transverse magnetic field. For superconducting coils e.g. according to [1] which are only disposed in parallel planes in one orientation (FIGS. 3a and b), control of $B_T$ (i.e. here $B_x$) perpendicular to the superconductor plane (yz) of the RF coil(s) is generally sufficient.

Figure 7:
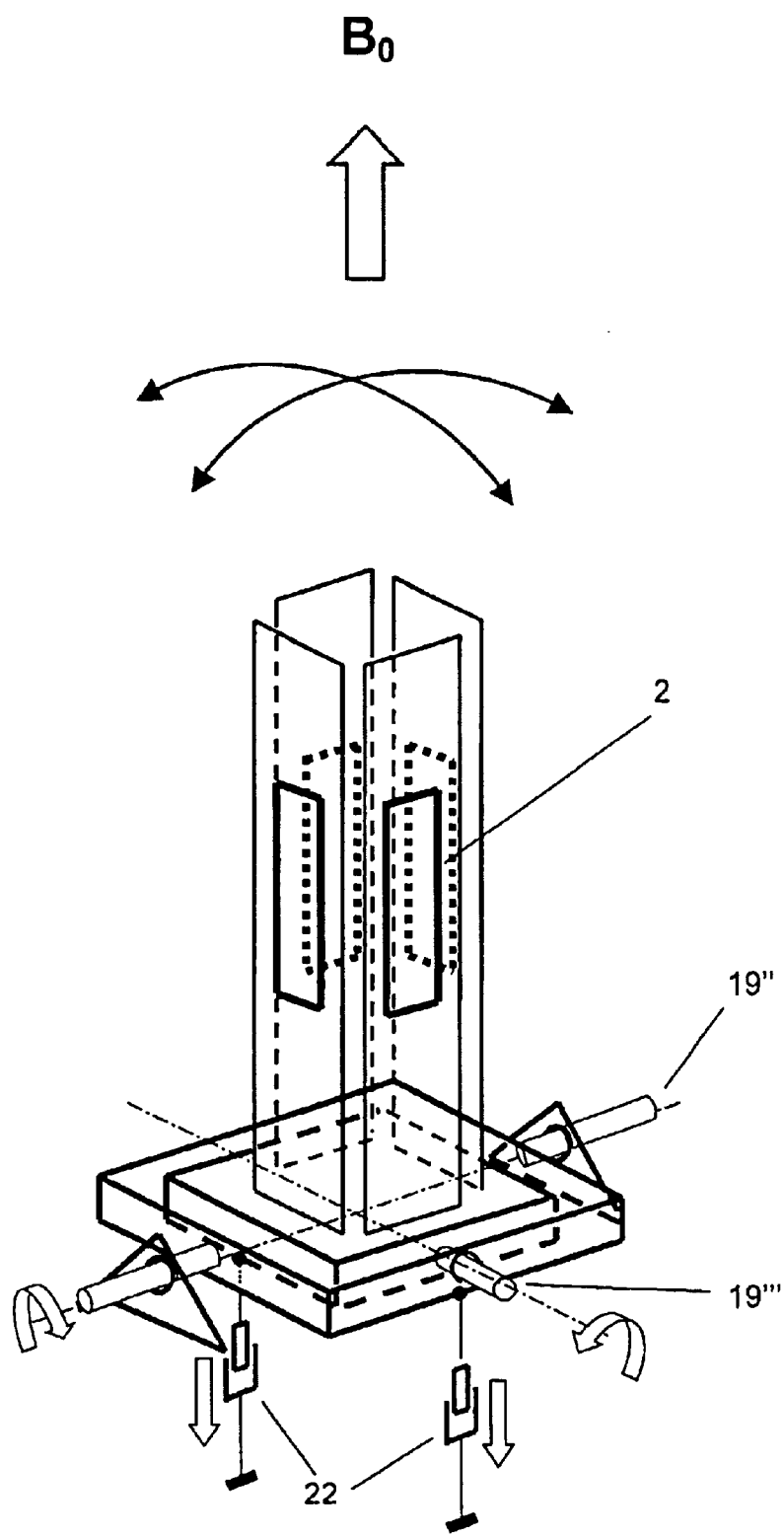
FIG. 7 shows a schematic spatial view of an inventive arrangement for controlling $B_x$ and $B_y$ with two degrees of freedom (tilt)

For more complicated arrangements or combinations of orthogonal coil pairs according to [1], both transverse magnetic field directions must be controlled (shown through 2-dimensional tilting in FIG. 7) and therefore also measured.

FIG. 1 shows a schematic representation of a preferred implementation of the inventive device. The transverse field detector 20 measures the transverse magnetic field components $B_T$. The detector 20 output communicates with an actuator 22 of a compensation device (tilting of the coils about an axis of rotation 19) via a control/regulation device. The control/regulating loop 29 of this compensation device assures that the transverse field components $B_T$ at the location of the superconducting RF coils 2 are always returned to the original state when deviations occur.

Mechanical devices are preferably used in the compensation device for tilting the SC coils. They produce a transverse field component which counteracts the disturbance. In other words, e.g. when the magnet tilts, the SC coils are tilted parallel to the magnet in the same direction and at exactly the same angle.

The coils therefore always follow the direction of the magnet to prevent generation of transverse field changes.

The tilt mechanism can preferably be driven by piezoelectric actuators or through electromagnetic forces acting on field coils preferably located in the magnetic field $B_0$ of the NMR magnet. Other drives, such as e.g. piezo-electrical motors, electromotors, step motors or the like can also be realized.

The compensation device can also consist of field coils 30 which produce an additional transverse field of a desired strength and direction. It is controlled such that the transverse magnetic field components $B_T$ at the coil location remain unchanged (FIG. 11 and FIG. 12 for both components $B_x$ and $B_y$). These field coils 30 can be mounted in the probe head 11, in the shim system, or on or in the cryomagnet.

In a preferred embodiment, the transverse field detector 20 shown in FIG. 1 is stationarily disposed as close as possible to the superconducting coils, i.e. rigidly connected to the probe head 11 (see detector 20" in FIG. 9) such that measurement of the transverse field components which actually act on the coils is as precise as possible. The control/regulation device can then control the compensation device having a device for tilting the RF coils such that the superconducting RF coils are always in the constant transverse field.

Figure 10:
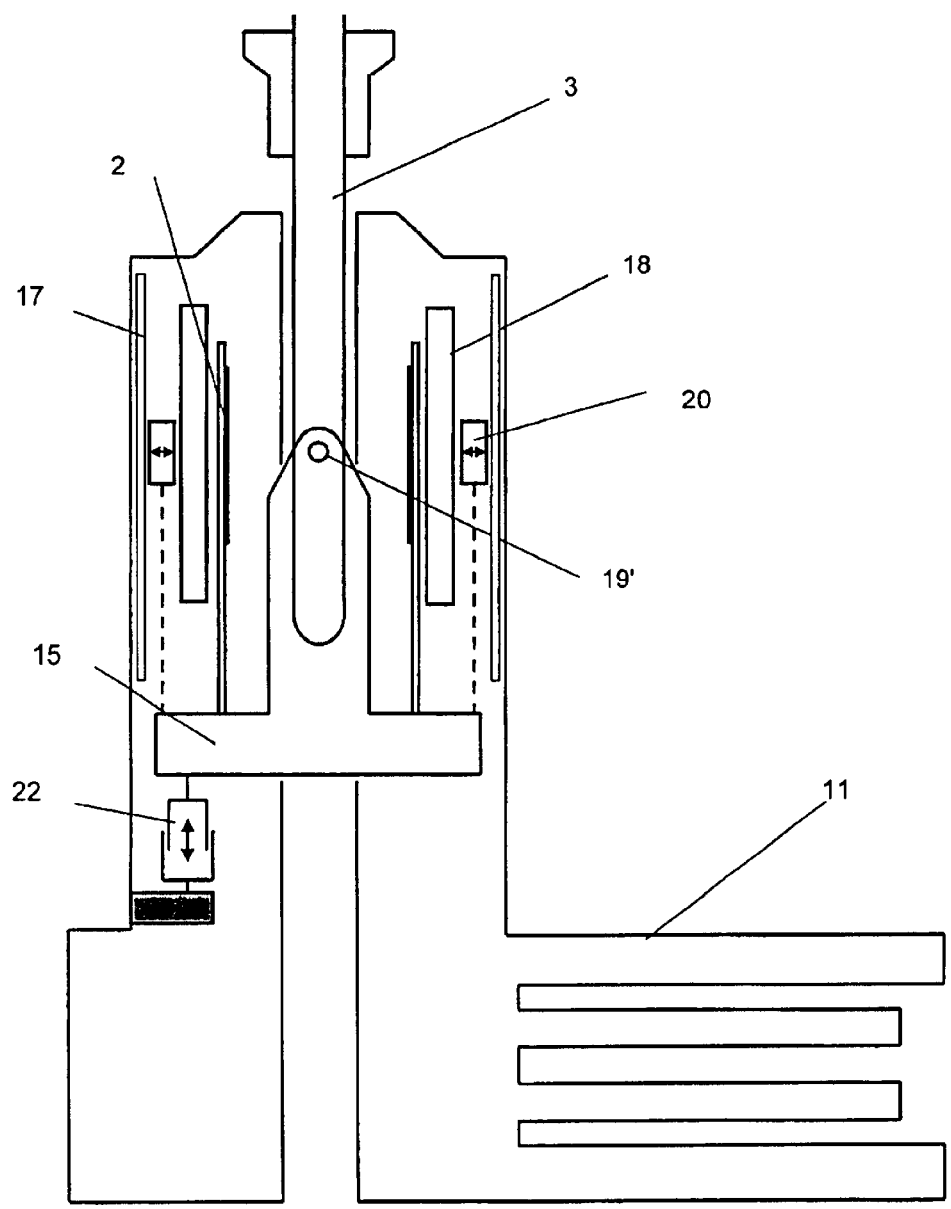
FIG. 10 shows an arrangement with axis of rotation within the region of the RF receiver coil arrangement.

In a further preferred embodiment, the transverse field detector 20 is placed as close to the superconducting RF coils 2 as possible and is rigidly connected thereto from an angular point of view (see FIG. 10). The compensation device tilts the RF coils 2 together with the detector 20 about the axis of rotation 19'. The regulating device can then control the compensation device such that the detector 20 and therefore the RF coils 2 always remain in the constant transverse field.

Figure 11:
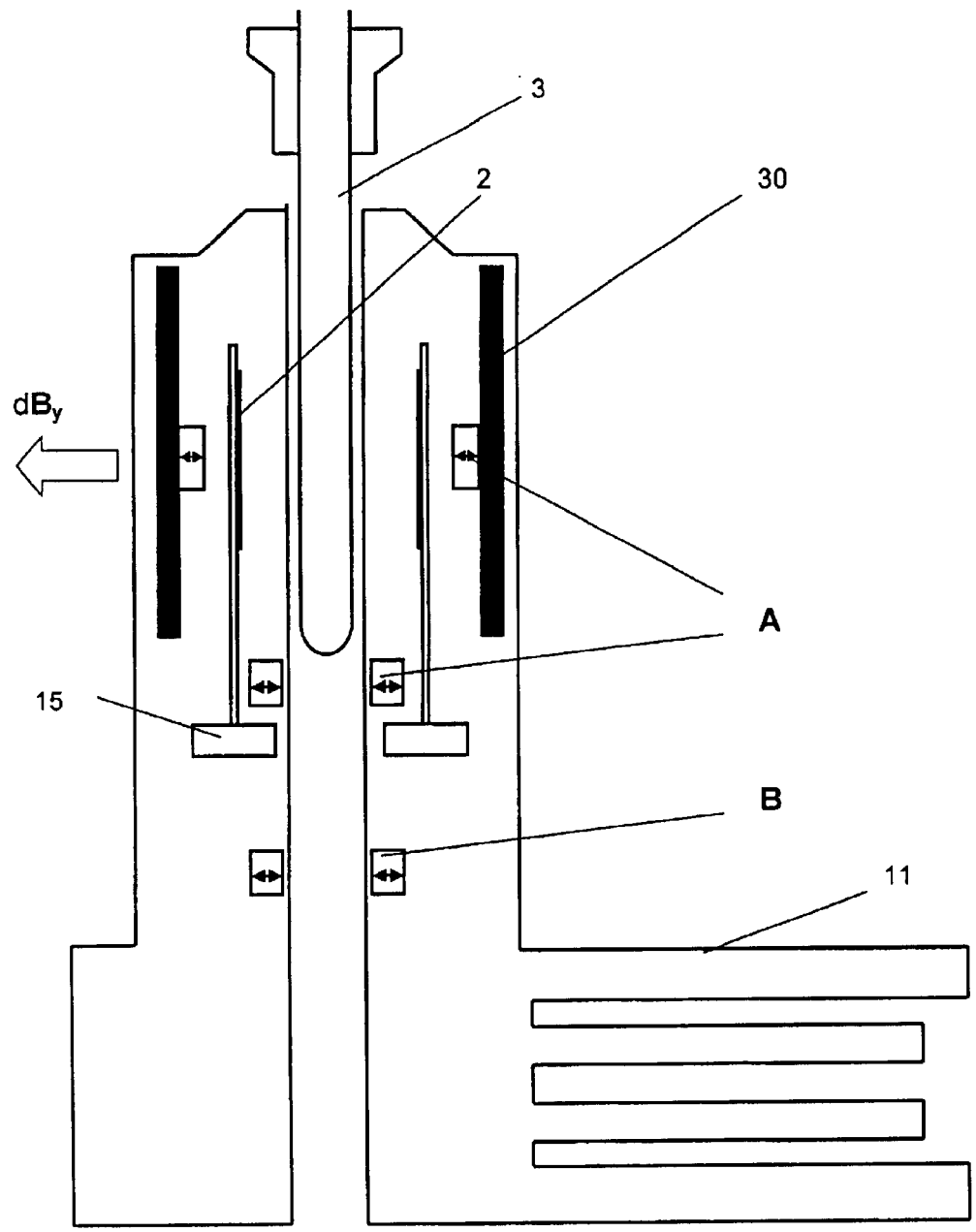
FIG. 11 shows an arrangement with compensation through use of field coils.
Figure 12:
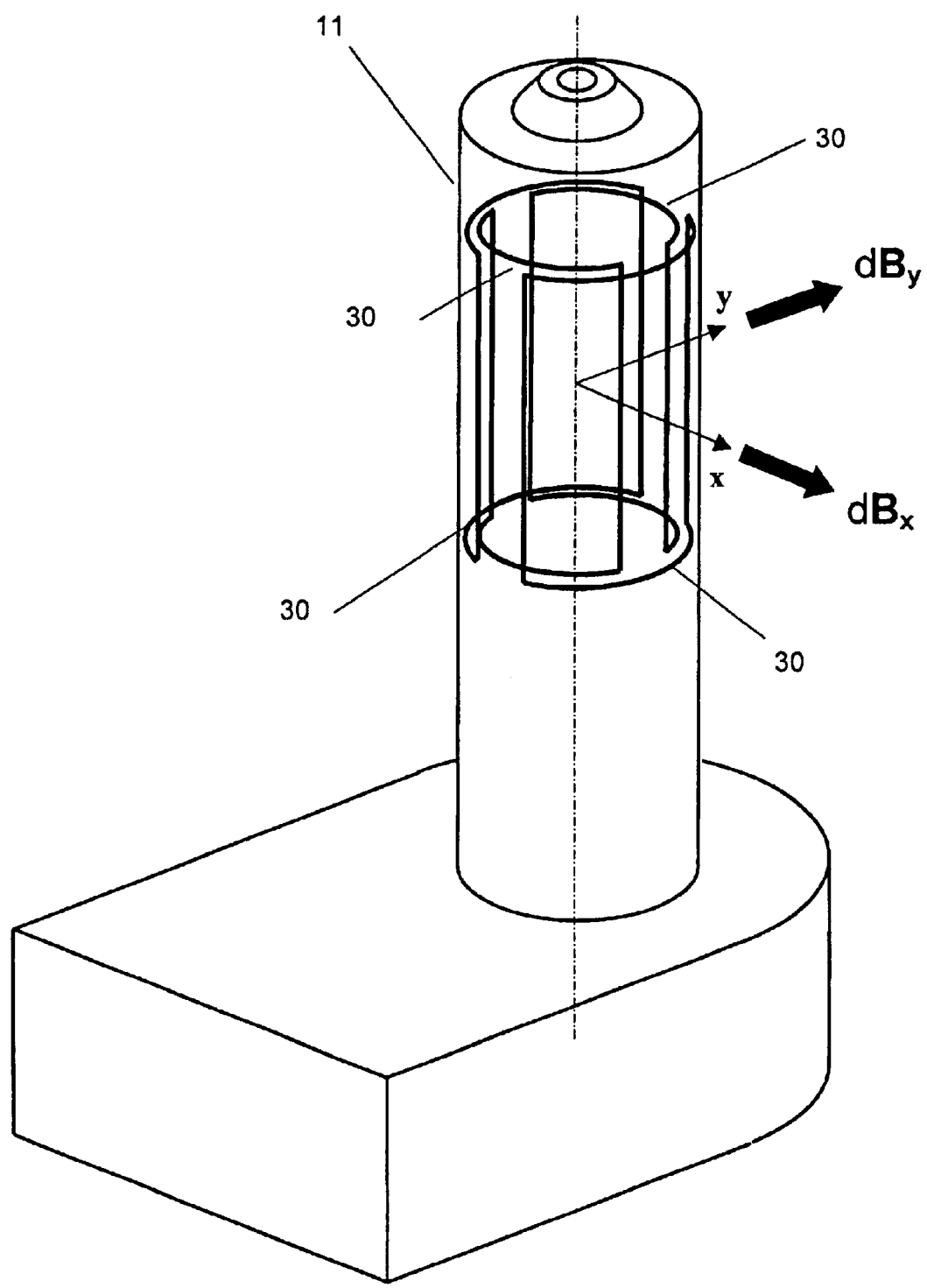
FIG. 12 shows a perspective sketch of an arrangement with 2 field coils for controlling the magnetic field component $B_x$ and $B_y$.

The same regulation to zero deviation in the detector can be applied when compensation coils are used which then acts in the same manner on both the coils and the detector (FIG. 11, position A).

It is in any case favourable to place the detector in the homogeneous field region since it is then ensured that the detector measures the same fields which the RF coils 2 experience. The detector is advantageously located in a region where the field gradients are smaller than 100 G/mm.

In another embodiment, the detector can be located at a certain separation from the RF coils 2 (FIG. 11, position B) when this is required for technical or constructive reasons. In such cases, the disturbances measured by the detector are not necessarily identical to those acting on the superconducting RF coils. In particular, the compensation device must no longer act equally on both the RF coils and the detector. In this case, complicated algorithms are required to keep the $B_T$ fields constant (beyond simple control of the compensation angle or via zero regulation of the detector). Arrangements of several sensors at different locations are also feasible from which the effective $B_T$ field at the location of the coils and the required compensation are determined.

As regards control algorithms in general, they can be largely adjusted to this problem. Analog or digital control is possible and the regulation bandwidth can be selected such that e.g. only slow disturbances are compensated for or vibrations and oscillations are also compensated for with a fast regulation loop.

A very favorable configuration is the combination of the compensation device with a normally conducting magnetic field shield 17 (FIG. 20). The high-frequency disturbances (vibrations etc.) are filtered out and the low-frequency and quasi-static disturbances can be regulated with the compensation device.

In a preferred arrangement, the shield 17 is rigidly connected to the probe head 11 and the arrangement of the superconducting resonator 2 and the detector 21 can be tilted about the axis 19 with respect to the probe head 11 in a controlled fashion such that the remaining $B_T$ changes which are damped by the shield 17 and which are therefore slow can be easily and precisely regulated by a sufficiently fast regulating loop.

This principle of coupling the passive and active stabilization can also be applied for a superconducting shield.

The devices which correct through tilting also offer different variants. In particular, the axes of rotation 19' (one or both directions) can be advantageously placed in the magnet center (see FIG. 10). This is advantageous, since the RF coils 2 thereby undergo minimal sideward displacement.

In an arrangement in which the detector 20 is not placed directly at the RF coils 2, the axis of rotation 19 can advantageously pass through the detector 20 (see FIG. 1). In this manner, the correction motions themselves, with their associated detector 20 movement, do not generate lateral positioning errors in the detector 20 which could otherwise produce additional measuring errors.

It should be noted that the above-mentioned systems, wherein the same transverse component acts on the detector 20 and on the RF coils 2, are basically operated in the regulation/compensation mode i.e. the detector signal is feedback regulated to zero (see e.g. FIG. 1).

Figure 8:
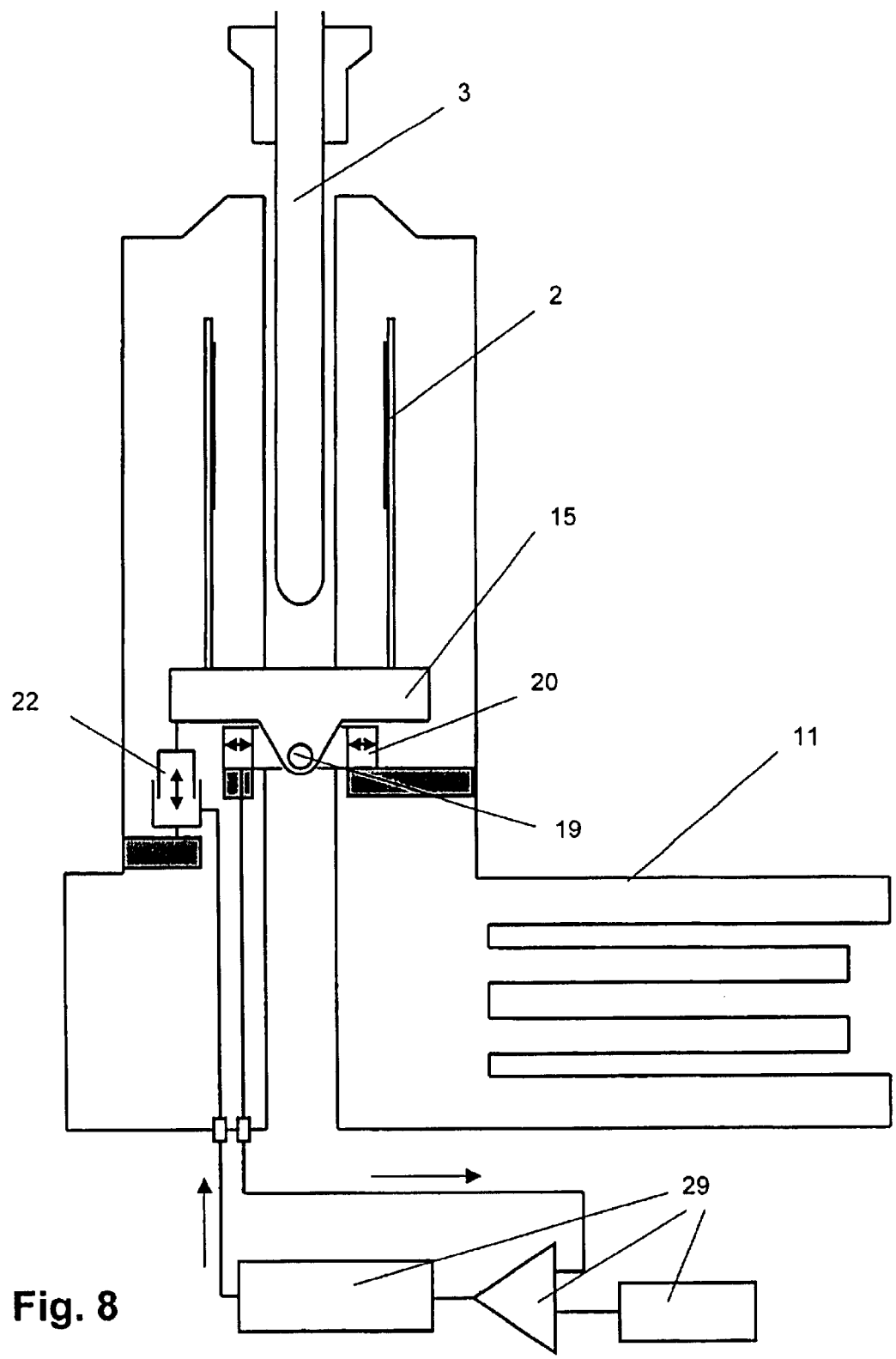
FIG. 8 shows a schematic vertical section through an arrangement with tilted coils but fixed detector.

On the other hand, the systems can be structured such that the actuator 22 does not act on the detector 20. The actuator 22 is then controlled via the detector signal such that the transverse field which acts on the RF coils 2 is kept constant. However, this requires very exact calibration of the system to achieve adequate accuracy (equivalent example in FIG. 8 or FIG. 9).

Two additional systems must be considered which are usually located in an NMR apparatus:

1. Shim System

FIG. 2 schematically shows a shim system 10 which produces further additional field changes during shimming. These are in general very small (magnitude of the full shim strengths is usually a few G/cm) and can be neglected, in particular when only small shim changes are effected since they typically neither significantly effect the RF coils 2 nor the detector 20. Since these disturbances are known, they can be fed into the regulation algorithm, if necessary, such that the latter automatically calculates the additional components produced by the shim system 10 and corrects them if desired.

2. Gradient System

Many probe heads have an installed gradient system which generates relatively strong, switched field gradients. A gradient system 18 (represented in FIGS. 9, 10, 20) produces additional magnetic fields in the sample volume which generate linearly variable $B_z$ components with a $B_z$ dependency proportional to x, y or z. These gradients are called "X, Y or Z gradients". They generate significant changes in the transverse field of a magnitude of 10 G/cm and more, and can produce undesired regulating action of the system.

Figure 9:
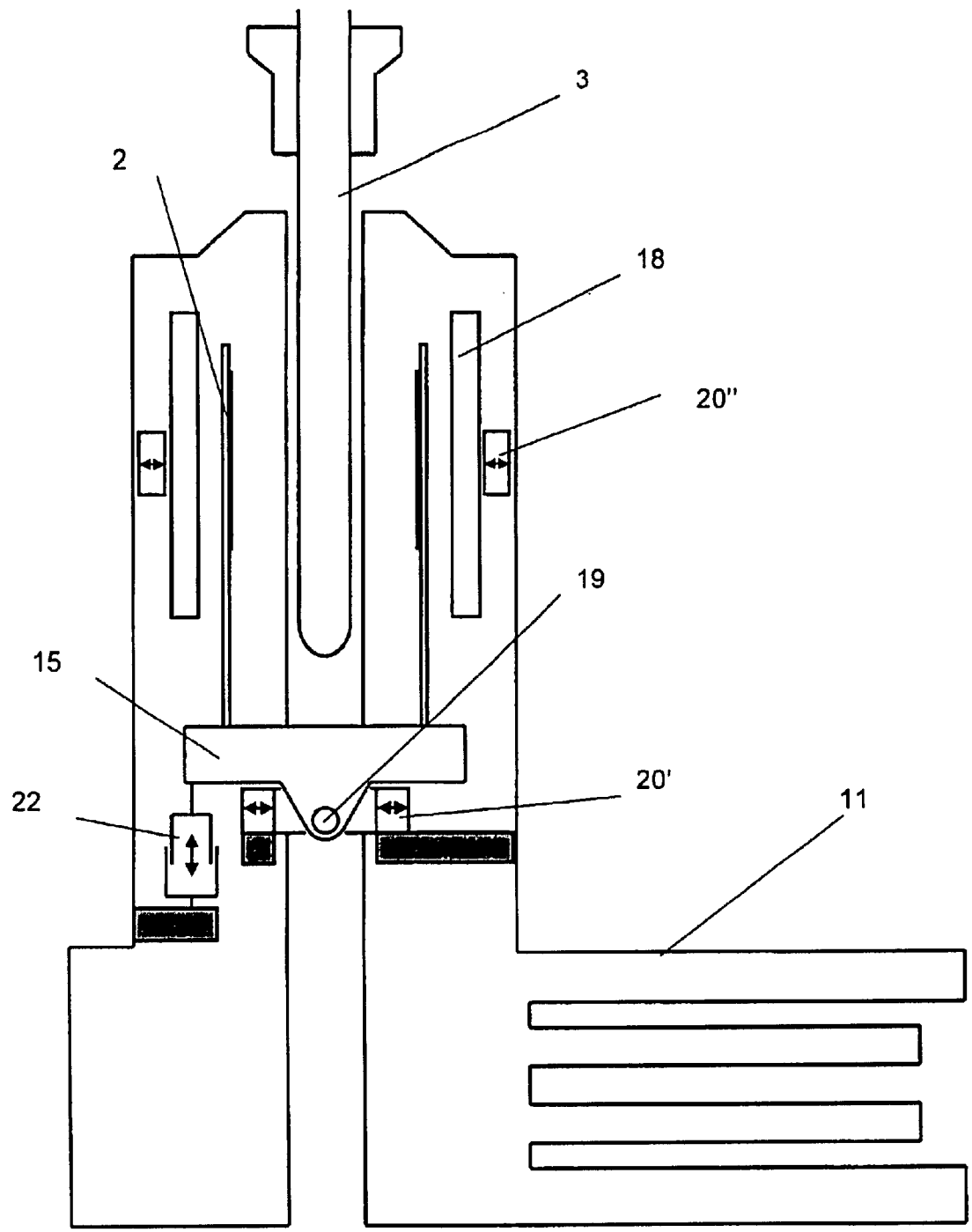
FIG. 9 shows an arrangement with a detector outside a gradient system.

This regulating action is not suitable, since the gradients are switched only briefly (typically e.g. 5 msec). During this time the field is in any event highly inhomogeneous and compensation is neither required nor desired. Compensation efforts during these strong pulses can generate regulating action which persists after the decay of the pulses and which requires a certain time until regulation returns to the initial state (before the gradient pulse). This unnecessarily delays recovery after the pulse, since it could necessitate waiting until regulation has stabilized. This can be overcome through the following measures:

i. mounting the detector axially in the z direction at a sufficient separation outside of the gradient (FIG. 9, detector 20'). The stray fields decay considerably with increasing separation outside of the gradient system 18.

ii. mounting the detector radially outside of the gradient (FIG. 9, detector 20"). Normally, the gradient systems are very well actively shielded such that the external fields become negligibly small.

iii. for X or Y gradients, the $B_T$ fields on the z=0 plane are identically zero for symmetry reasons. Arrangement of the detector on this plane or symmetrically thereto does not produce any signals.

iv. when z gradients are used, the gradient fields and stray fields are rotationally symmetrical. Rotationally symmetrical detector arrangements therefore produce no signals. This is the case anywhere on the z axis and also for symmetrical arrangements of e.g. two Hall probes or more at points which are opposite or arranged at uniform angles at the same separation about the z axis (FIG. 13c). This is also true for use of a pick-up coil which is disposed symmetrically about the z axis (FIG. 13d).

v. the influence during the active time of the gradient can also be compensated for through calculation.

vi. finally, the system can be set to "hold" during the gradient time such that changes in the inputs are ignored and no corrections are carried out.

In total, the requirements with regard to the shim system fields or the switched field gradients can be satisfied such that they do not hinder implementation of the inventive stabilization.

The following can be added concerning the mode of operation of an inventive device:

1. As described above, the system can be used for stabilizing the transverse fields for coils which are in a demagnetised state. The system would be switched on when the RF coils have been demagnetised (using any method, e.g. [2]). Then, the RF coils remain steady and permanently demagnetised as long as the system remains active and functions correctly.
2. The field disturbances of any superconducting coils are kept very low and constant.
3. RF coils which are naturally insensitive to transverse fields (see [5], [6]) become more stable during operation since, in addition to the low sensitivity to the transverse fields, these fields are kept small. This effects a double (quadratic) control of the disturbing fields and therefore extremely small NMR disturbances at the sample location. This combination forms the basis for new low levels of field disturbances as are required e.g. for superconducting NMR coils and extremely small samples.
4. In addition to maintenance of the obtained low disturbances, this method offers a further very interesting advantage: If the stabilization system is activated before the superconducting RF coils are cold and during the cooling procedure while the coils are still above $T_c$ and is kept active during the SC transition and during later operation without interruption, generation of transverse magnetization can be completely prevented. If the SC layer is always exactly parallel to the homogeneous magnetic field $B_0$, transverse magnetization cannot be generated solely for reasons of symmetry. The SC can therefore be cooled such that it is free from transverse magnetization and the methods according to [2], [3] can be omitted.
5. The compensation/regulation system advantageously comprises additional signal inputs. Correction inputs can be provided if required to compensate for known disturbances (e.g. additional shimming possibility if errors are generated or for correcting known systematic deviations during cooling. It can preferably be used during cooling to maintain an exact orientation of thin layered coils parallel to $B_0$ for precisely zero transverse magnetization).

Prior Art References

[1] U.S. Pat. No. 5,619,140
[2] WO 99/24845
[3] WO 99/24821
[4] U.S. Pat. No. 5,572,127
[5] DE 197 33 574 A1
[6] DE 101 50 131.5 (not previously published)
[7] U.S. Pat. No. 5,585,723

I claim:

1. A nuclear magnetic resonance (NMR) spectrometer comprising:
   a magnet arrangement for producing a homogeneous static magnetic field $B_O$ in a z-axis direction;
   a radio frequency (RF) resonator having one or more superconducting components, said resonator for receiving NMR signals from a measuring volume; and
   a stabilization device, said stabilization device keeping magnetic field components $B_T$ constant, which act on said superconducting components of said RF resonator, transverse to the homogeneous magnetic field $B_O$ to substantially prevent distortion of said NMR signals in consequence of induced transverse magnetization of said superconducting components of said radio frequency resonator due to changes in said $B_T$ field components.

2. The NMR spectrometer of claim 1, wherein said stabilization device comprises a transverse field shield containing normally conducting components and surrounding a periphery of said RF resonator, wherein said shield is rigidly connected to said RF resonator in a controlled fashion with respect to a relative tilt to at least attenuate said transverse magnetic field components $B_T$ which act on said RF resonator.

3. The NMR spectrometer of claim 2, wherein said transverse shield comprises additional superconducting components and wherein said transverse shield cannot be tilted.

4. The NMR spectrometer of claim 2, wherein said transverse field shield is interrupted in said z axis direction at one or more points through slits which permit unhindered passage of a z component of the homogeneous static magnetic field $B_0$.

5. The NMR spectrometer of claim 1, wherein said stabilization device comprises a superconducting transverse field shield which is one of flat, sheet-like and consisting of discrete wire-shaped or layered conductors, said shield surrounding a periphery of said RF resonator and being rigidly connected thereto in a controlled fashion with respect to relative tilt to keep constant said magnetic field components $B_T$ acting on said RF resonator.

6. The NMR spectrometer of claim 5, wherein said shield cannot be tilted.

7. The NMR spectrometer of claim 5, wherein said transverse field shield is interrupted in said z axis direction at one or more points through slits which permit unhindered passage of a z component of the homogeneous static magnetic field $B_0$.

8. The NMR spectrometer of claim 1, wherein said stabilization device comprises means for rotating said superconducting components of said RF resonator about an axis which is not directed parallel to the homogeneous magnetic field $B_0$.

9. The NMR spectrometer of claim 1, wherein said stabilization device comprises means for rotating said superconducting components of said RF resonator about two axes which are neither mutually parallel nor parallel to the homogeneous magnetic field $B_0$.

10. The NMR spectrometer of claim 1, wherein said stabilization device comprises one or more magnetic field coils which produce transverse magnetic fields in a region of said superconducting components of said RF resonator.

11. The NMR spectrometer of claim 1, further comprising a detection device is which measures said transverse magnetic field components $B_T$, wherein said stabilization device comprises an active compensation device to which measured transverse magnetic field components $B_T$ are supplied for feedback or control, wherein said active compensation device keeps said transverse magnetic field components constant in a region of said superconducting components of said RF resonator.

12. The NMR spectrometer of claim 11, wherein said detection device for measuring said transverse magnetic field components $B_T$ comprises at least one Hall probe.

13. The NMR spectrometer of claim 12, wherein at least one of said at least one Hall probes is coupled to a superconducting loop such that said loop increases a sensitivity of said Hall probe to said transverse magnetic field component to be measured.

14. The NMR spectrometer of claim 11, wherein said detection device for measuring said transverse magnetic field components $B_T$ comprises at least one SQUID sensor which is coupled to said transverse magnetic field through one or more superconducting loops.

15. The NMR spectrometer of claim 11, wherein said detection device for measuring said transverse magnetic field components $B_T$ comprises one or more electrically conducting pick-up loops which are periodically tilted and whose induced voltages are evaluated.

16. The NMR spectrometer of claim 15, wherein said pick-up loops are oriented in a working position with an average surface position substantially perpendicular to the homogeneous magnetic field $B_0$.

17. The NMR spectrometer of claim 15, wherein said detection device comprises a means for phase-sensitive detection of said induced voltage in said pick-up loop.

18. The NMR spectrometer of claim 17, wherein phase-sensitive evaluation of said induced voltage in said pick-up loop occurs with a base frequency of tilt motion.

19. The NMR spectrometer of claim 15, wherein two or more oppositely periodically tilted pick-up loops are circuited such that $B_T$ signal components add.

20. The NMR spectrometer of claim 19, wherein said oppositely tilted coils are dimensioned, operated with tilt amplitudes, and circuited in such a manner that signal components which result from the homogeneous magnetic field $B_0$ cancel with maximized accuracy.

21. The NMR spectrometer of claim 15, wherein one of a single pick-up coil, a single coil pair, and a single coil system having several pickup coils is provided for each of degree of freedom associated with said transverse field components $B_T$.

22. The NMR spectrometer of claim 15, wherein one of a single pick-up coil, a single coil pair, and a single coil system is provided to periodically tilt about two non-parallel axes for both degrees of freedom associated with said transverse magnetic field components $B_T$.

23. The NMR spectrometer of claim 22, wherein tilt motions are phase-shifted with time and evaluation of said induced voltages is effected using two phase-synchronous detectors whose reference phases are also mutually phase-shifted and synchronized with said tilt motions.

24. The NMR spectrometer of claim 23, wherein said tilt motions are phase-shift by 90°.

25. The NMR spectrometer of claim 11, wherein said detection device for measuring said transverse magnetic field components $B_T$ comprises an NMR transmitting/receiving system which determines an absolute value of a magnetic field in the measuring volume through determination of a nuclear resonance frequency, wherein transverse field component changes $dB_T$ are converted into longitudinal field component changes $dB_0$ through neighboring superconducting structures.

26. The NMR spectrometer of claim 11, wherein transverse field component changes $dB_T$ which act on said detection device largely correspond to those acting on said superconducting components of said RF resonator, and further comprising a regulating means to constantly control said transverse magnetic field component $B_T$ measured with said detection device.

27. The NMR spectrometer of claim 26, wherein said regulating means comprises one of a PI and PID regulator to zero said transverse field components.

28. The NMR spectrometer of claim 11, wherein said detection device is disposed outside of a complete influence of said compensation device, and said compensation device is controlled in dependence on measured transverse field components such that said transverse magnetic field components $B_T$ are kept constant in a region of said superconducting components of said RF resonator.

29. The NMR spectrometer of claim 11, wherein said detection device is disposed in a direct vicinity of said superconducting components of said RF resonator.

30. The NMR spectrometer of claim 11, wherein said detection device is disposed in a direct vicinity of a magnetic center of said magnet arrangement for producing a homogeneous static magnetic field $B_0$.

31. The NMR spectrometer of claim 30, wherein said direct vicinity of said magnetic center is a region with $|dB_0/dz|<100$ G/mm.

32. The NMR spectrometer of claim 11, wherein said detection device is disposed radially outside of a gradient system.

33. The NMR spectrometer of claim 32, wherein said detection device is disposed radially outside of a shielded said gradient system.

34. The NMR spectrometer of claim 11, wherein said detection device is disposed on a magnet axis.

35. The NMR spectrometer of claim 11, wherein said detection device comprises several partial detectors disposed about said z axis to measure said transverse magnetic field components $B_T$ at said z axis.

36. The NMR spectrometer of claim 11, wherein said compensation device has axes of rotation extending through said superconducting components of said RF resonator.

37. The NMR spectrometer of claim 11, wherein said compensation device has axes of rotation extending through said detection device.

38. The NMR spectrometer of claim 11, wherein said compensation device has further signal inputs for carrying out additional corrections of said transverse fields which are caused by at least one of other influences, mechanical creeping, and thermal deformation of components.

39. The NMR spectrometer of claim 11, wherein said compensation device comprises at least one piezo actuator for tilting said superconducting components of said RF resonator.

40. The NMR spectrometer of claim 11, wherein said compensation device comprises at least one conductor loop for tilting said superconducting components of said RF resonator, said conductor loop being supplied with current produced by a control electronics to move in the magnetic field via Lorentz forces.

41. The NMR spectrometer of claim 11, wherein said compensation device is already activated before or during cooling of said superconducting components of said RF resonator and remains activated during cooling below a superconducting transition temperature $T_c$.

42. The NMR spectrometer of claim 11, wherein said compensation device is switched on at any desired time to keep constant said $B_T$ fields present at said time.

43. The NMR spectrometer of claim 42, wherein said compensation device is switched on after demagnetisation of the superconducting components of the RF resonator.

44. The NMR spectrometer of claim 1, wherein disturbances are evaluated taking into consideration known influences produced by a shim system.

45. The NMR spectrometer of claim 44, wherein additional fields produced through changes of a setting of said shim system are taken into consideration in a correction process.

46. The NMR spectrometer of claim 44, wherein said disturbances are evaluated taking into consideration known influences produced by a gradient system.

47. The NMR spectrometer of claim 46, wherein additional fields which are generated through gradient switching are taken into consideration in a correction.

48. The NMR spectrometer of claim 47, wherein no corrections are made while said gradient is switched.

49. The NMR spectrometer of claim 1, wherein said transverse field components are actively controlled and high-frequency said transverse field components are simultaneously attenuated with a transverse field shield.

* * * * *